US012764925B2

(12) United States Patent
Cho et al.

(10) Patent No.: US 12,764,925 B2
(45) Date of Patent: Oct. 13, 2026

(54) METHOD OF MANUFACTURING A SEMICONDUCTOR DEVICE

(71) Applicant: Samsung Electronics Co., Ltd., Suwon-si (KR)

(72) Inventors: Seongkeun Cho, Suwon-si (KR); Suhwan Hwang, Suwon-si (KR); Kanguk Kim, Suwon-si (KR); Yihwan Kim, Suwon-si (KR); Jihoon Kim, Suwon-si (KR); Jinhyung Park, Suwon-si (KR); Hyunsu Shin, Suwon-si (KR); Taemin Earmme, Suwon-si (KR); Sungwook Jung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 249 days.

(21) Appl. No.: 18/636,744

(22) Filed: Apr. 16, 2024

(65) Prior Publication Data

US 2024/0381616 A1 Nov. 14, 2024

(30) Foreign Application Priority Data

May 12, 2023 (KR) ........................ 10-2023-0061727

(51) Int. Cl.
*H10B 12/00* (2023.01)

(52) U.S. Cl.
CPC ............. *H10B 12/03* (2023.02); *H10B 12/09* (2023.02); *H10B 12/315* (2023.02); *H10B 12/482* (2023.02)

(58) Field of Classification Search
None
See application file for complete search history.

(56) References Cited

U.S. PATENT DOCUMENTS 6,228,762 B1 * 5/2001 Park .................... H10W 20/081 257/E21.257
7,329,953 B2 2/2008 Tu
(Continued)

FOREIGN PATENT DOCUMENTS

| | | | |
|---|---|---|---|
| JP | 5756692 | B2 | 7/2015 |
| TW | 202232281 | A | 8/2022 |
| TW | 202318584 | A | 5/2023 |

OTHER PUBLICATIONS

Notice of Allowance dated Nov. 27, 2025 issued in corresponding Taiwanese Patent Application No. 113114609.
(Continued)

*Primary Examiner* — Khaja Ahmad
(74) *Attorney, Agent, or Firm* — Harness, Dickey & Pierce, P.L.C.

(57) ABSTRACT

A method may include forming a first gate structure on a first region of a substrate, forming a bit line structure on the first gate structure, forming a preliminary contact plug layer including amorphous silicon on the substrate, forming a reflective layer structure on the preliminary contact plug layer, forming a contact plug layer from the preliminary contact plug layer, and forming a capacitor on the contact plug layer. The reflective layer structure may include first and second reflective layers. A refractive index of the second reflective layer may be being greater than that of the first reflective layer. Portions of the second reflective layer may have different thicknesses on first and second regions of the substrate. The forming the contact plug layer may include performing a melting laser annealing (MLA) process on the reflective layer structure to convert the amorphous silicon of the preliminary contact plug layer into polysilicon.

20 Claims, 48 Drawing Sheets

(56) References Cited

U.S. PATENT DOCUMENTS

| | | | |
|---|---|---|---|
| 9,892,919 | B2 | 2/2018 | Nakazawa et al. |
| 10,211,210 | B2 | 2/2019 | Ma et al. |
| 11,101,167 | B2 | 8/2021 | Matsuo |
| 11,424,168 | B2 | 8/2022 | Mikami et al. |
| 11,474,646 | B2 | 10/2022 | Yamazaki et al. |
| 2005/0093147 | A1 | 5/2005 | Tu |
| 2016/0064226 | A1 | 3/2016 | Kawashima et al. |
| 2016/0365279 | A1* | 12/2016 | Koo ........................ H10P 14/46 |
| 2017/0345824 | A1 | 11/2017 | Ma et al. |
| 2020/0402981 | A1* | 12/2020 | Kim ................... H10B 12/0335 |
| 2021/0013212 | A1* | 1/2021 | Kim ..................... H10B 12/315 |
| 2021/0159113 | A1* | 5/2021 | Choi ................... H10W 20/072 |
| 2021/0384318 | A1 | 12/2021 | Birner et al. |
| 2022/0037335 | A1 | 2/2022 | Ma et al. |
| 2022/0223744 | A1 | 7/2022 | Duriez et al. |
| 2023/0125400 | A1 | 4/2023 | Ting et al. |
| 2023/0128492 | A1 | 4/2023 | Cho et al. |

OTHER PUBLICATIONS

Extended European Search Report dated Oct. 14, 2024 for corresponding European Patent Application No. 24174923.3.

European Office Action dated May 13, 2026 for corresponding European Patent Application No. 24174923.3.

* cited by examiner

METHOD OF MANUFACTURING A SEMICONDUCTOR DEVICE

CROSS-REFERENCE TO RELATED APPLICATION

This application claims priority under 35 U.S.C. § 119 to Korean Patent Application No. 10-2023-0061727 filed on May 12, 2023 in the Korean Intellectual Property Office, the disclosure of which is hereby incorporated by reference in its entirety.

TECHNICAL FIELD

Example embodiments of the present disclosure relate to a method of manufacturing a semiconductor device. More particularly, example embodiments of the present disclosure relate to a method of manufacturing a DRAM device.

DISCUSSION OF RELATED ART

In a DRAM device, the DRAM device may include a cell region with different than structures than structures in a peripheral circuit region of the DRAM device. As a size of features decreases and a degree of integration increases, research is developing to manufacture the DRAM device to have excellent performance while addressing issues due to the integration of the DRAM device.

SUMMARY

Example embodiments provide a method of manufacturing a semiconductor device having improved electrical characteristics.

According to example embodiments of inventive concepts, a method of manufacturing a semiconductor device may include forming a first gate structure on a first region of a substrate, the substrate including the first region and a second region; forming a bit line structure on the first gate structure; forming a preliminary contact plug layer including amorphous silicon on the substrate; forming a reflective layer structure on the preliminary contact plug layer, the reflective layer structure including a first reflective layer having a first refractive index and a second reflective layer having a second refractive index, the second refractive index being greater than the first refractive index, and a thickness of a portion of the second reflective layer on the first region of the substrate being different than a thickness of a portion of the second reflective layer on the second region of the substrate; forming a contact plug layer from the preliminary contact plug layer, the forming the contact plug layer including performing a melting laser annealing (MLA) process of irradiating a laser on the reflective layer structure so that the amorphous silicon of the preliminary contact plug layer is converted into polysilicon; and forming a capacitor on the contact plug layer.

According to example embodiments of inventive concepts, a method of manufacturing a semiconductor device forming a first gate structure on a cell region of a substrate, the substrate including the cell region and a peripheral circuit region; forming a bit line structure on the first gate structure; forming a preliminary contact plug layer including amorphous silicon on the substrate; forming a reflective layer structure on the preliminary contact plug layer, the reflective layer structure including a first reflective layer having a first refractive index and a second reflective layer having a second refractive index, the second refractive index being greater than the first refractive index; forming a contact plug layer from the preliminary contact plug layer, the forming the contact plug layer including performing a melting laser annealing (MLA) process of irradiating a laser on the reflective layer structure so the amorphous silicon of the preliminary contact plug layer is converted into polysilicon; and forming a capacitor on the contact plug layer. A reflective ratio of light on the peripheral circuit region of the substrate is greater than a reflective ratio of the light on the cell region of the substrate.

According to example embodiments of inventive concepts, a method of manufacturing a semiconductor device forming a first gate structure on a cell region of a substrate, the substrate including the cell region and a peripheral circuit region; forming a bit line structure and a second gate structure on the cell region and the peripheral circuit region, respectively, of the substrate; forming a preliminary contact plug layer including amorphous silicon on the substrate to cover the bit line structure and the second gate structure; forming a reflective layer structure on the preliminary contact plug layer, the reflective layer structure including a first reflective layer having a first refractive index and a second reflective layer having a second refractive index, the second refractive index being greater than the first refractive index, and a thickness of a portion of the second reflective layer on the cell region of the substrate being different than a thickness of a portion of the second reflective layer on the peripheral circuit region of the substrate; performing a melting laser annealing (MLA) process that includes irradiating a laser on the reflective layer structure so that the preliminary contact plug layer is converted into a contact plug layer including polysilicon; planarizing the lower contact plug layer to form a lower contact plug; forming an upper contact plug on the lower contact plug; and forming a capacitor on the upper contact plug.

In example embodiments, in the method of manufacturing a semiconductor device, a phenomenon in which silicon included in the conductive pattern of the bit line structure moves into the barrier pattern to generate a void may be limited and/or prevented. Additionally, the MLA process in which the preliminary lower contact plug layer is melted to be converted into the lower contact plug layer including polysilicon may have an increased margin, and thus may be easily performed.

DETAILED DESCRIPTION

Figure 1:
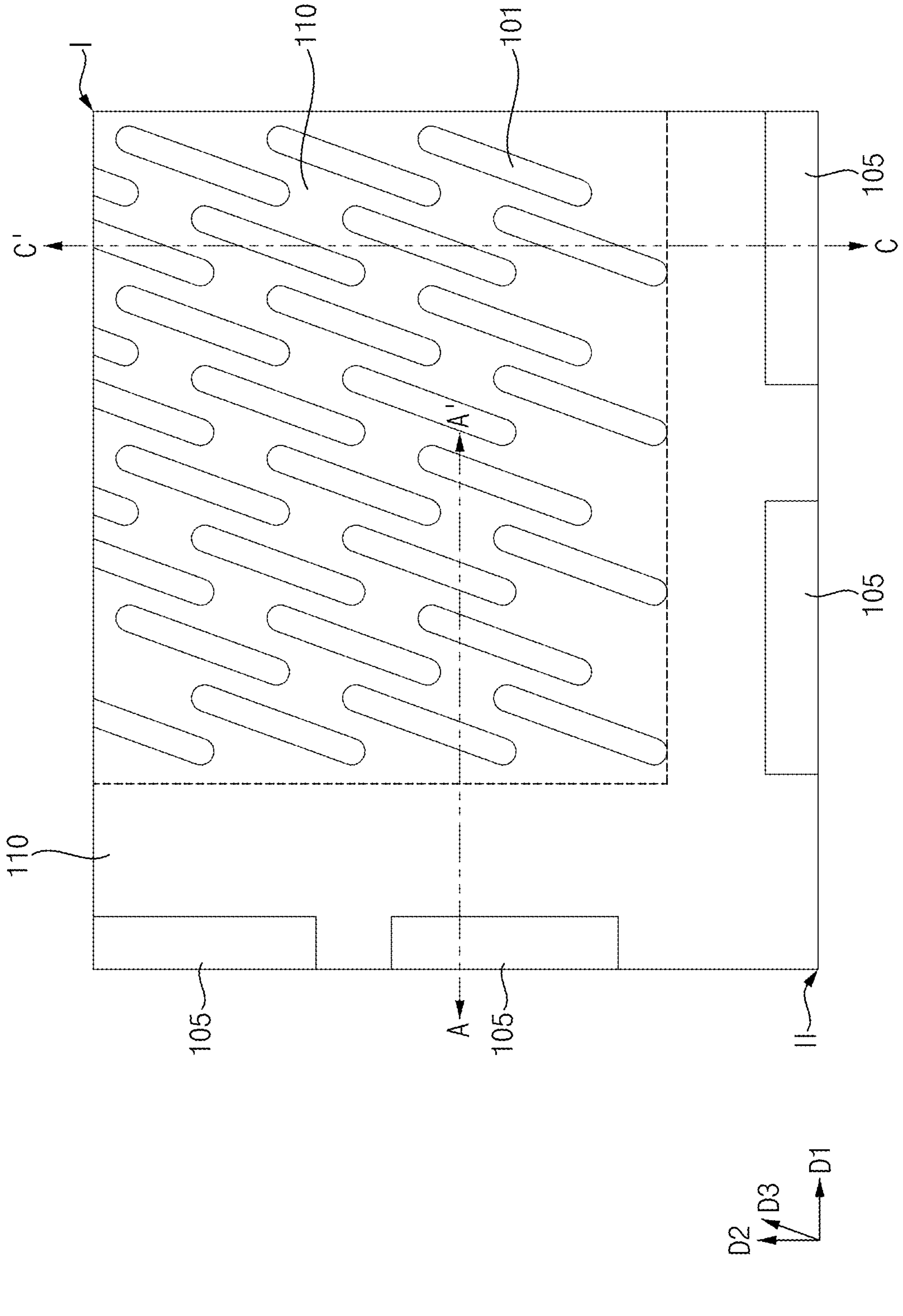
FIGS. 1 to 43 are plan views and cross-sectional views illustrating a method of manufacturing a semiconductor device according to example embodiments.

The above and other aspects and features of a decoupling capacitor structure and a method of forming the same, and a semiconductor device including the decoupling capacitor structure and a method of manufacturing the same in accordance with example embodiments will become readily understood from detail descriptions that follow, with reference to the accompanying drawings. It will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second or third element, component, region, layer or section without departing from the teachings of inventive concepts.

Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

When the terms "about" or "substantially" are used in this specification in connection with a numerical value, it is intended that the associated numerical value includes a manufacturing or operational tolerance (e.g., +10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., +10%) around the stated numerical values or shapes.

While the term "equal to" is used in the description of example embodiments, it should be understood that some imprecisions may exist. Thus, when one element is referred to as "equal to" another element, it should be understood that an element or a value may be "equal to" another element within a desired manufacturing or operational tolerance range (e.g., +10%).

FIGS. 1 to 43 are plan views and cross-sectional views illustrating a method of manufacturing a semiconductor device according to example embodiments. Specifically, FIGS. 1, 4, 7, 13, 18, 29, 33, 37 and 40 are the plan views, FIGS. 2, 5, 8, 11, 14, 17, 19, 22, 30, 34-35, 38 and 41 are cross-sectional views taken along lines A-A' of corresponding plan views, respectively, FIGS. 9, 12, 15, 20, 23, 31-32, 36, 39 and 42 are cross-sectional views taken along lines B-B' of corresponding plan views, respectively, FIGS. 3, 6, 10, 16, 21, 24, 26 and 43 are cross-sectional views taken along lines C-C' of corresponding plan views, respectively, and FIGS. 25 and 27-28 are cross-sectional views taken along lines E-E' of corresponding plan views, respectively.

Hereinafter, in the specification (and not necessarily in the claims), two directions substantially parallel to an upper surface of a substrate 100 and substantially perpendicular to each other may be referred to as first and second directions D1 and D2, respectively, and a direction substantially parallel to the upper surface of the substrate 100 and having an acute angle with respect to the first and second directions D1 and D2 may be referred to as a third direction D3. A direction substantially the same as or similar to perpendicular to the upper surface of the substrate 100 may be referred to as a vertical direction.

Figure 2:
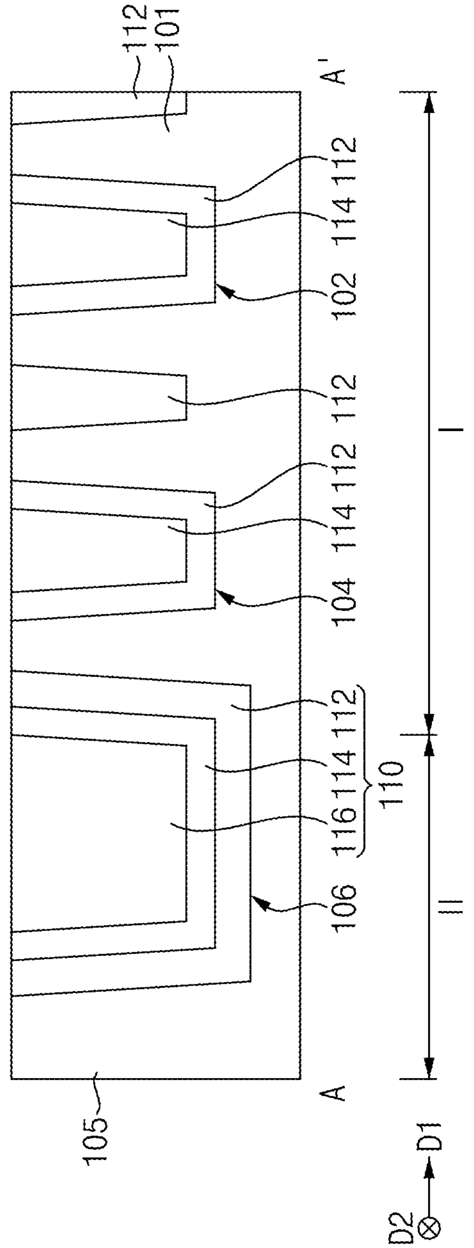
Figure 3:
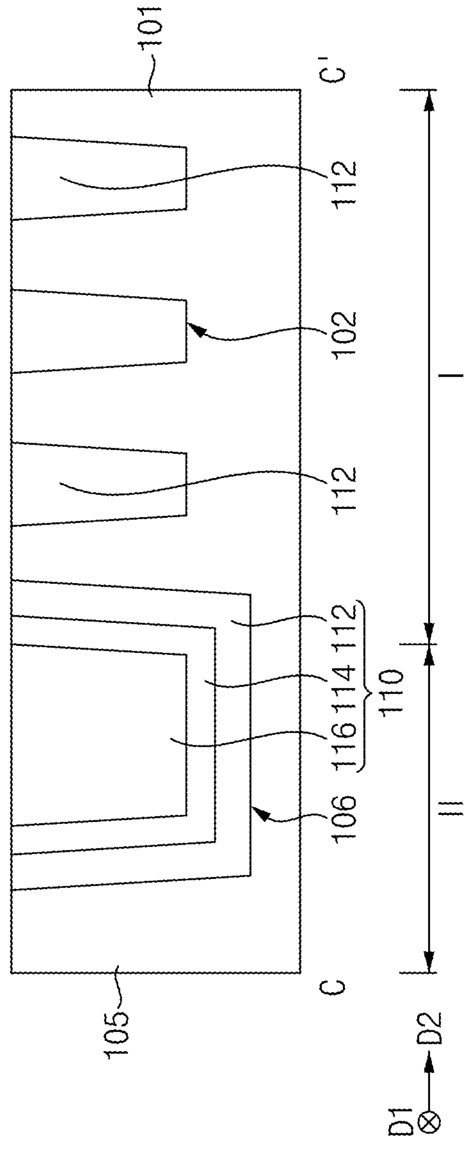

Referring to FIGS. 1 to 3, first and second active patterns 101 and 105 may be formed on the substrate 100 including first and second regions I and II.

The substrate 100 may include silicon, germanium, silicon-germanium, or a III-V group compound semiconductor, such as GaP, GaAs, or GaSb. In example embodiments, the substrate 100 may be a silicon-on-insulator (SOI) substrate or a germanium-on-insulator (GOI) substrate.

The first region I of the substrate 100 may be a cell region on which memory cells are formed, and the second region II of the substrate 100 surrounding the first region I of the substrate 100 may be a peripheral circuit region on which peripheral circuit patterns for driving the memory cells are formed. FIGS. 1 to 3 show a portion of the first region I and portions of the second region II adjacent to the first region I in the first and second directions D1 and D2, respectively.

The first and second active patterns 101 and 105 may be formed by removing an upper portion of the substrate 100 to form a recess structure. The first active pattern 101 may extend in the third direction D3 on the first region I, and a plurality of first active patterns 101 may be spaced apart from each other in each of the first and second directions D1 and D2. Additionally, a plurality of second active patterns 105 may be spaced apart from each other in each of the first and second directions D1 and D2.

The recess structure may include first, second and third recesses 102, 104 and 106. The first recess 102 may be formed between ones of the first active patterns 101 spaced apart from each other by a relatively small distance, the second recess 104 may be formed between ones of the first active patterns 101 spaced apart from each other by a relatively large distance, and the third recess 106 may be formed on the second region II of the substrate 100 or between the first and second regions I and II of the substrate 100.

In example embodiments, the third recess 106 may have a width and/or a depth greater than a width and/or a depth of the second recess 104, and the second recess 104 may have a width and/or a depth greater than a width and/or a depth of the first recess 102.

An isolation structure 110 may be formed to cover sidewalls of the first and second active patterns 101 and 105.

In example embodiments, the isolation structure 110 may include first, second and third isolation patterns 112, 114 and 116 sequentially stacked on an inner wall of the third recess 106. However, the first and second isolation patterns 112 and 114 may be formed in the second recess 104 having a width smaller than that of the third recess 106, and the first isolation pattern 112 may be formed in the first recess 102 having a width smaller than that of the second recess 104.

Each of the first and third isolation patterns 112 and 116 may include an oxide, e.g., silicon oxide, and the second isolation pattern 114 may include an insulating nitride, e.g., silicon nitride.

Figure 4:
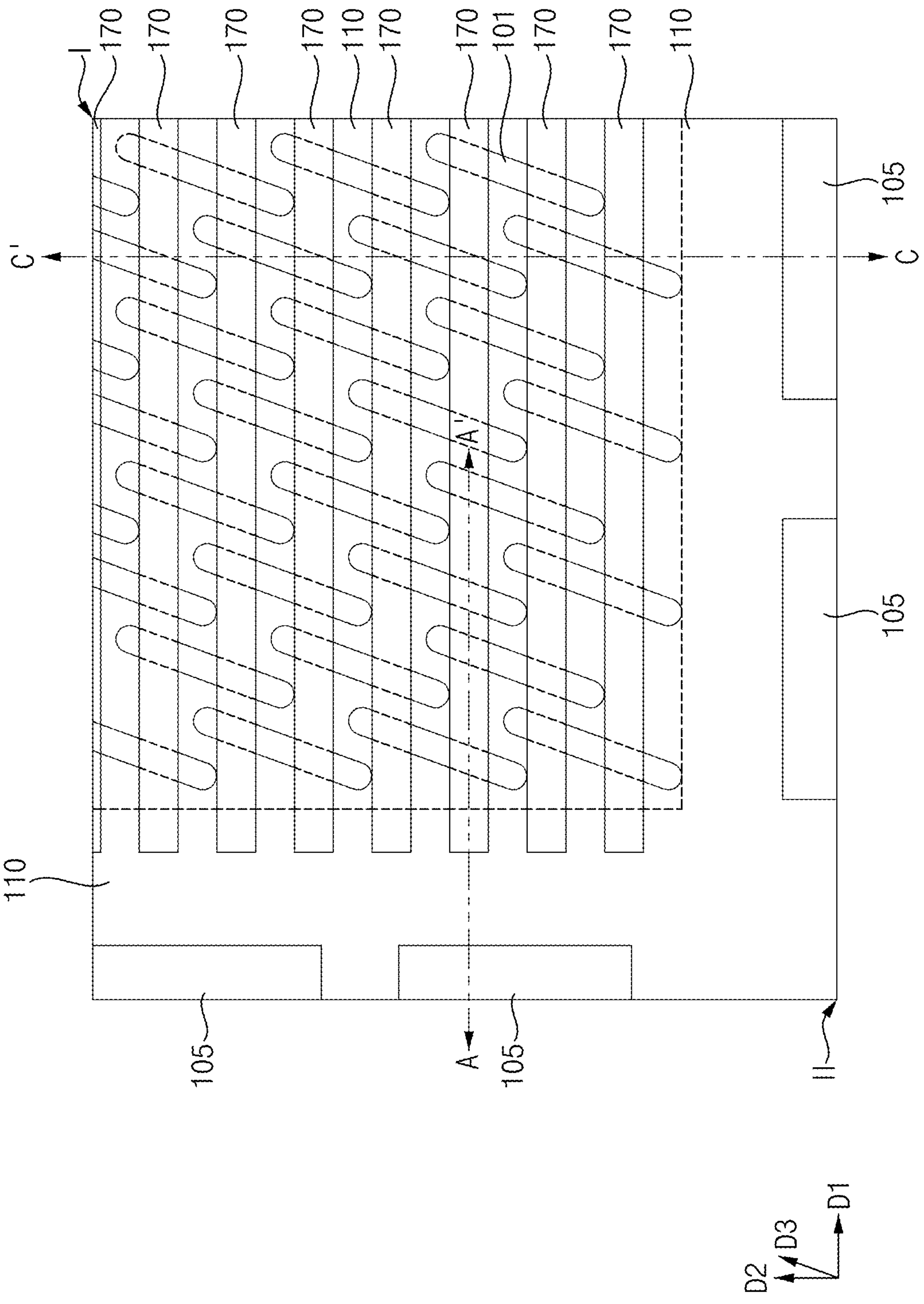
Figure 5:
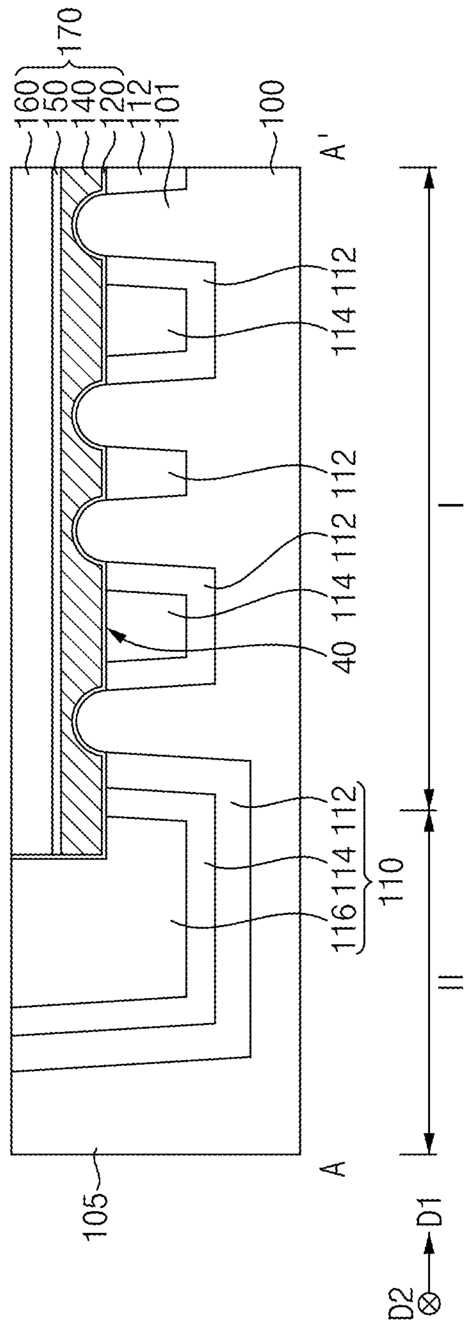
Figure 6:
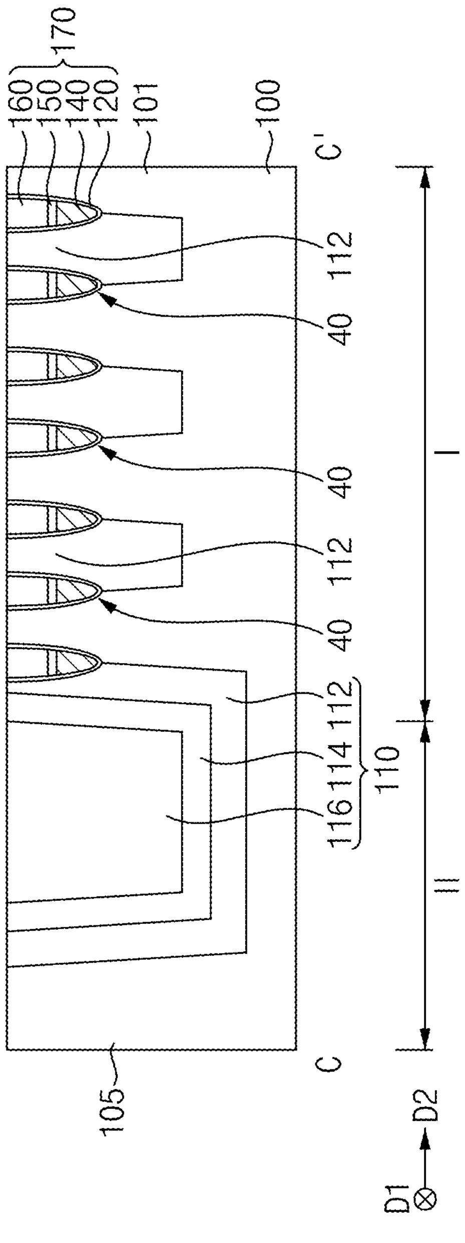
Figure 7:
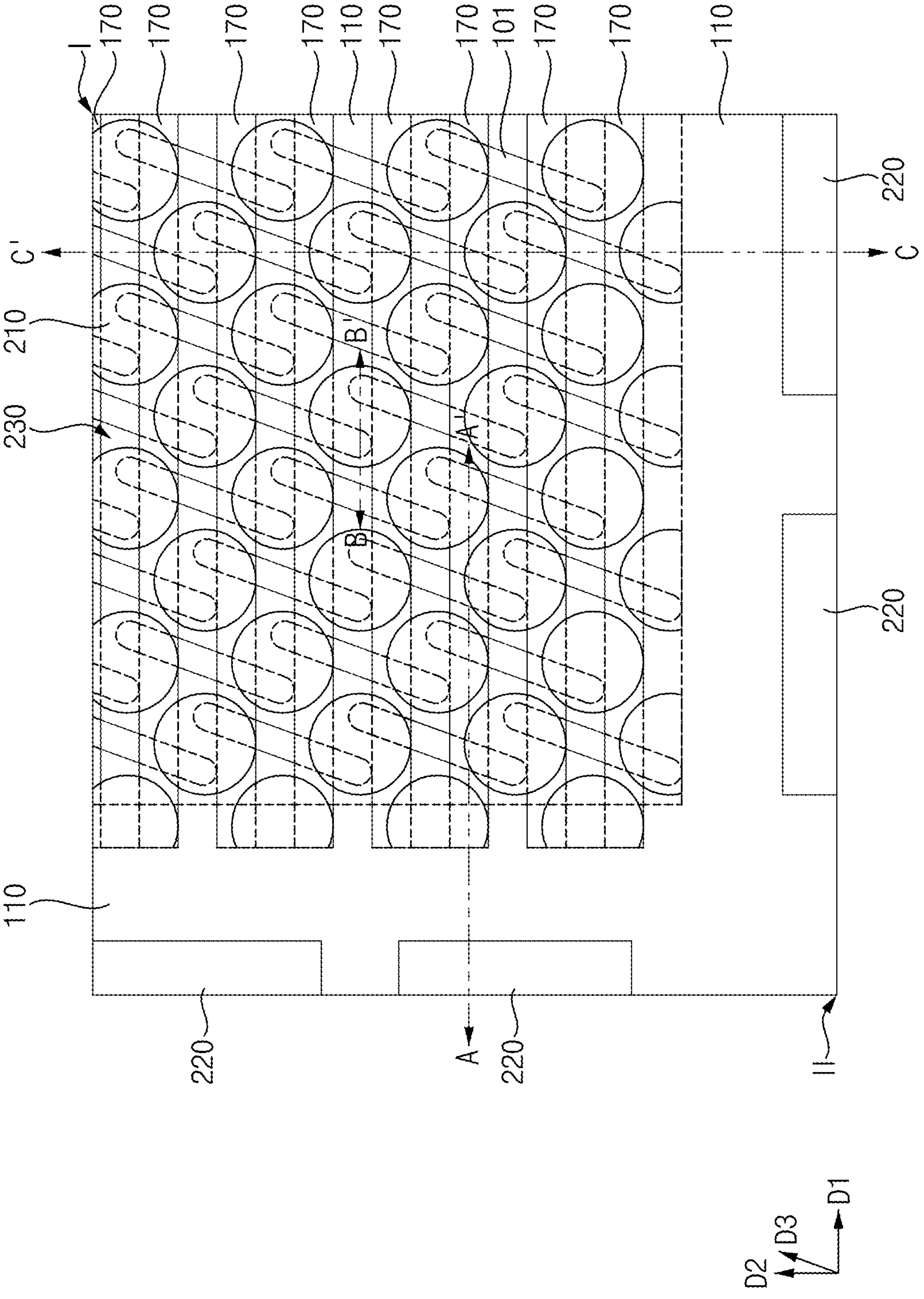
Figure 8:
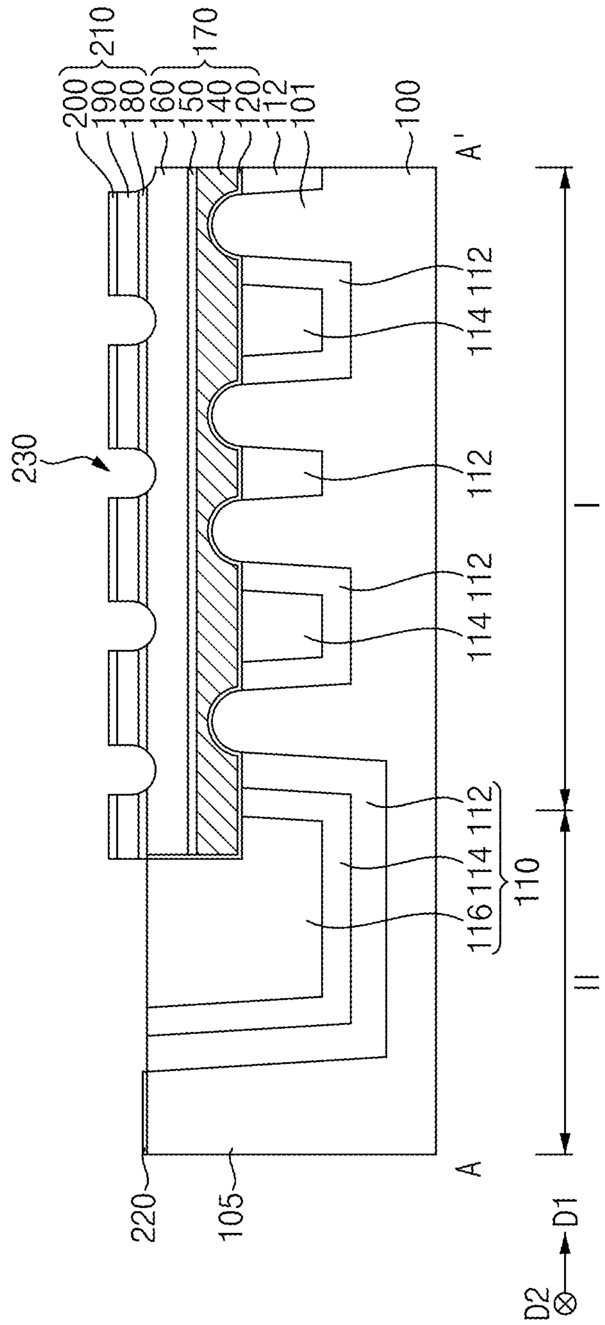
Figure 9:
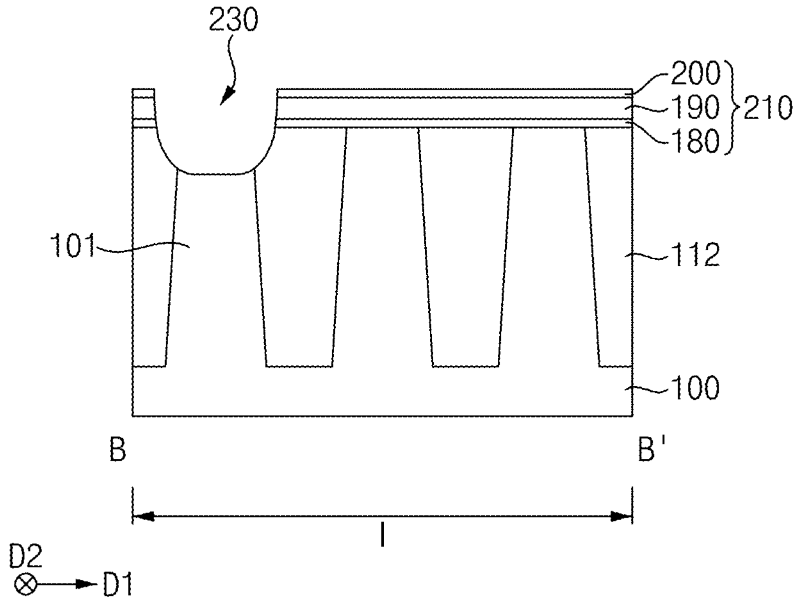
Figure 10:
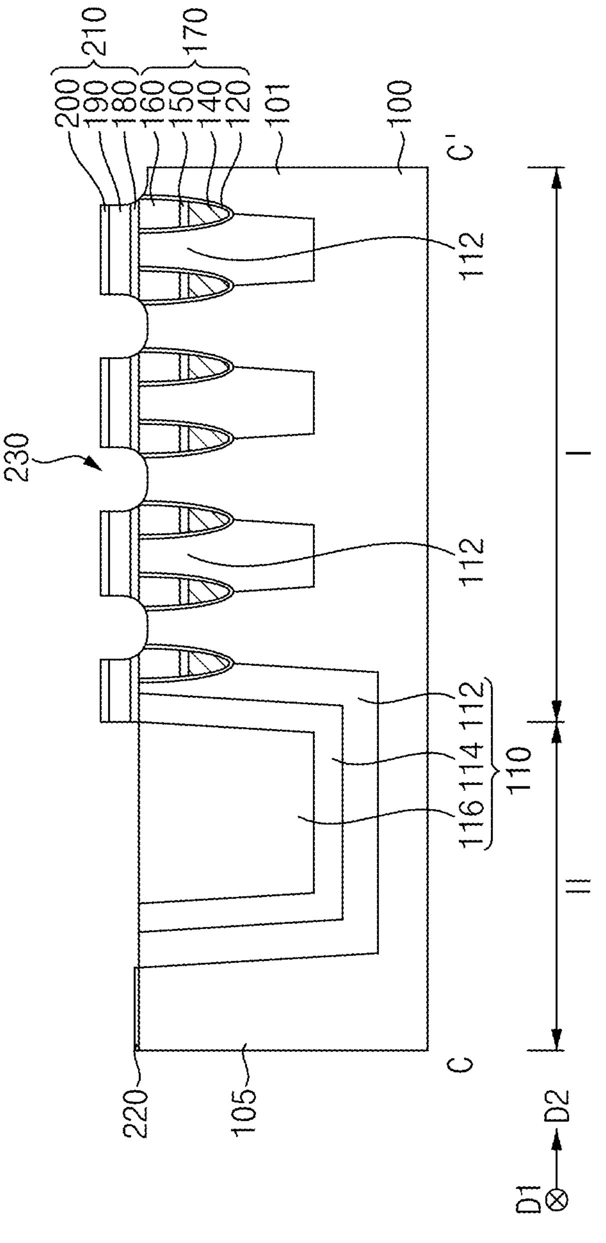

Referring to FIGS. 4 to 6, an etching process may be performed on the first active pattern 101 and the isolation structure 110 on the first region I of the substrate 100 and a portion of the second region II of the substrate 100 adjacent to the first region I of the substrate 100 to form a fourth recess 40.

In example embodiments, during the etching process, the first active pattern 101 including a semiconductor material may be less etched than the isolation structure 110 including an insulating material due to the etching selectivity. Thus, the fourth recess 40 may have a concave upper surface on an upper surface of the first active pattern 101.

A first gate insulation layer and a first conductive layer may be sequentially stacked on an inner wall of the fourth recess 40 and upper surfaces of the first and second active patterns 101 and 105 and the isolation structure 110, the first gate insulation layer and the first conductive layer may be planarized until the upper surfaces of the first and second active patterns 101 and 105 and the isolation structure 110 are exposed, and an upper portion of the first conductive layer may be removed by, e.g., an etch back process.

The planarization process may include a chemical mechanical polishing (CMP) process and/or an etch back process.

By the planarization process, a first gate insulation pattern 120 may be formed on the inner wall of the fourth recess 40, and by the etch back process, a first conductive pattern 140 may be formed on the first gate insulation pattern 120 to fill a lower portion of the fourth recess 40.

A second conductive pattern 150 may be formed on the first conductive pattern 140, a first gate mask layer may be formed on the second conductive pattern 150, the first and second active patterns 101 and 105 and the isolation structure 110 to fill the fourth recess 40, and the first gate mask layer may be planarized until the upper surfaces of the first and second active patterns 101 and 105 and the isolation structure 110 are exposed, so that a first gate mask 160 may be formed to fill an upper portion of the fourth recess 40. The first conductive pattern 140 and the second conductive pattern 150 may collectively form a gate electrode, and a first barrier pattern may be further formed between the first gate insulation pattern 120 and the first conductive pattern 140.

The first gate insulation pattern 120 may include an oxide, e.g., silicon oxide, the first barrier pattern may include a metal nitride, e.g., titanium nitride, tantalum nitride, etc., the first conductive pattern 140 may include a metal, a metal nitride, a metal silicide, doped polysilicon, etc., the second conductive pattern 150 may include doped polysilicon, and the first gate mask 160 may include a nitride, e.g., silicon nitride.

The first gate insulation pattern 120, the first barrier pattern, the first conductive pattern 140, the second conductive pattern 150 and the first gate mask 160 in the fourth recess 40 may collectively form a first gate structure 170. In example embodiments, the first gate structure 170 may extend in the first direction D1 on the first region I of the substrate 100 and the portion of the second region II of the substrate 100 adjacent to the first region I of the substrate 100, and a plurality of first gate structures 170 may be spaced apart from each other in the second direction D2. End portions in the first direction D1 of the first gate structures 170 may be aligned with each other in the second direction D2 on the portion of the second region II of the substrate 100.

Referring to FIGS. 7 to 10, an insulation layer structure 210 may be formed on the first and second regions I and II of the substrate 100, a portion of the insulation layer structure 210 on the second region II of the substrate 100 except for the portion of the second region II of the substrate 100 adjacent to the first region I of the substrate 100 may be removed.

For example, a thermal oxidation process may be performed on the second active pattern 105 on the second region II of the substrate 100 to form a second gate insulation layer 220.

The insulation layer structure 210 may be patterned, and the first active pattern 101, the isolation structure 110, and the first gate mask 160 of the first gate structure 170 may be partially etched using the patterned insulation layer structure 210 as an etching mask to form a first opening 230. In example embodiments, the patterned insulation layer structure 210 may have a shape of a circle or an ellipse in a plan view, and a plurality of insulation layer structures 210 may be spaced apart from each other in the first and second directions D1 and D2 on the first region I of the substrate 100 and the portion of the second region II of the substrate 100 adjacent to the first region I of the substrate 100. Each of the insulation layer structures 210 may overlap opposite end portions in the third direction D3 of the first active patterns 101 in a vertical direction substantially perpendicular to the upper surface of the substrate 100.

Figure 11:
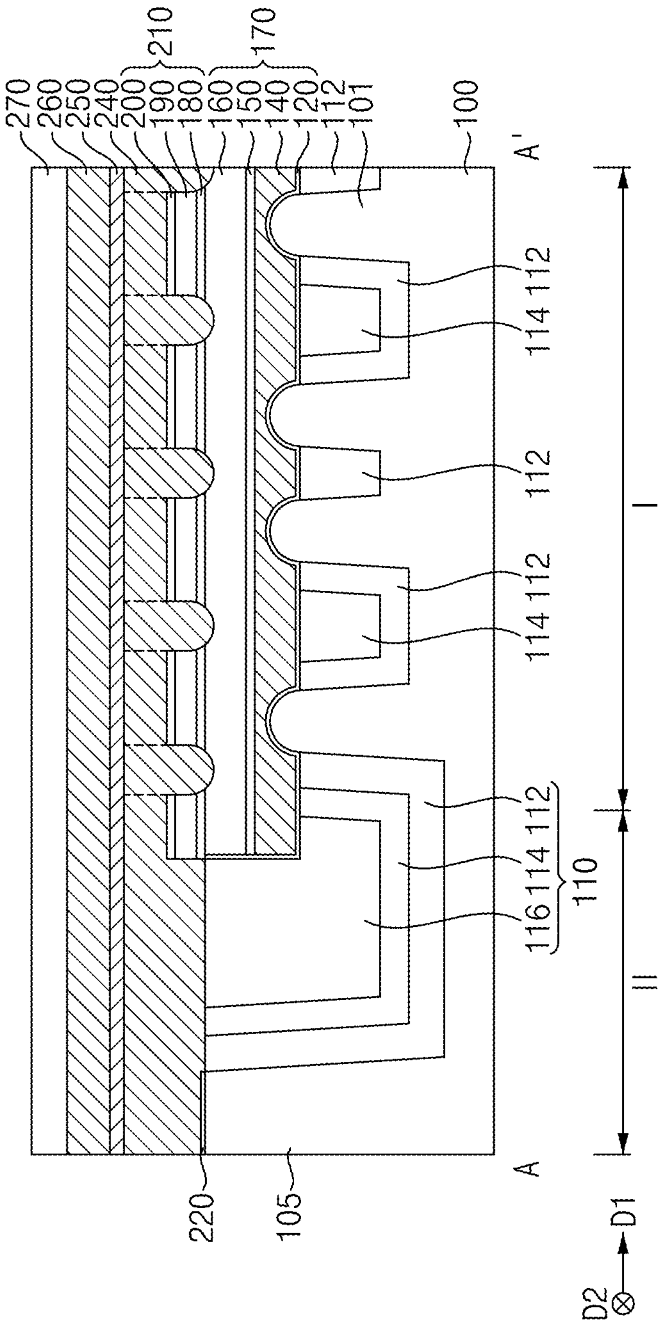
Figure 12:
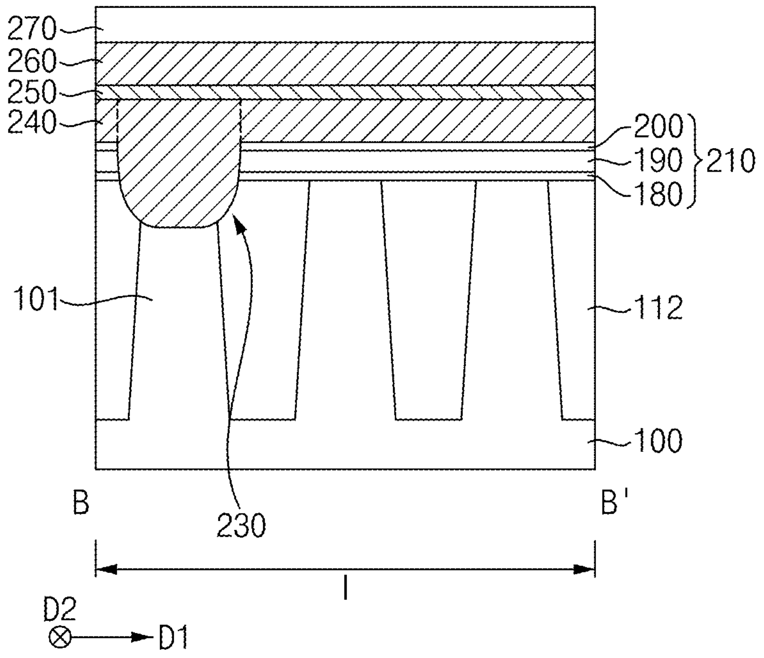
Figure 13:
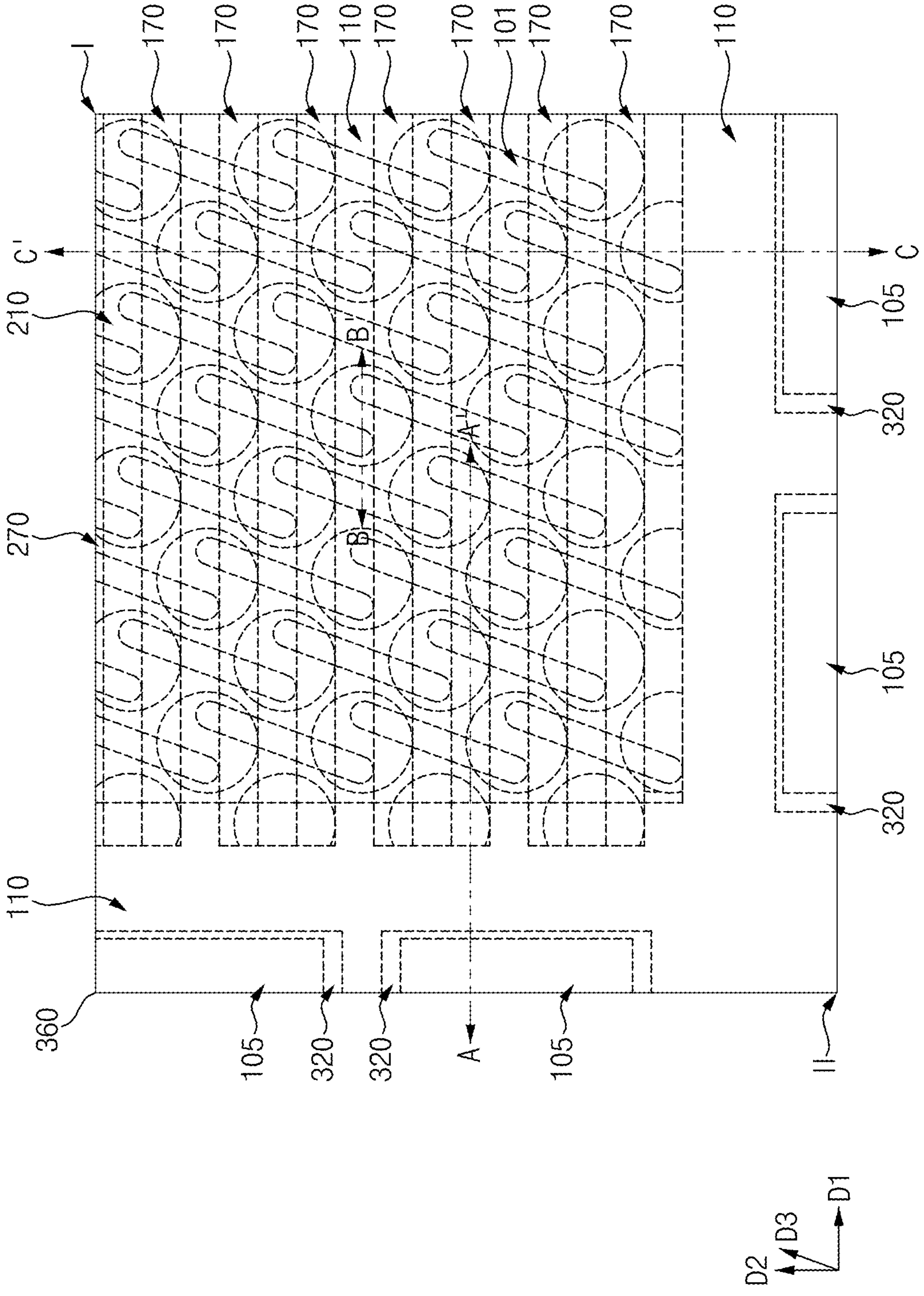
Figure 14:
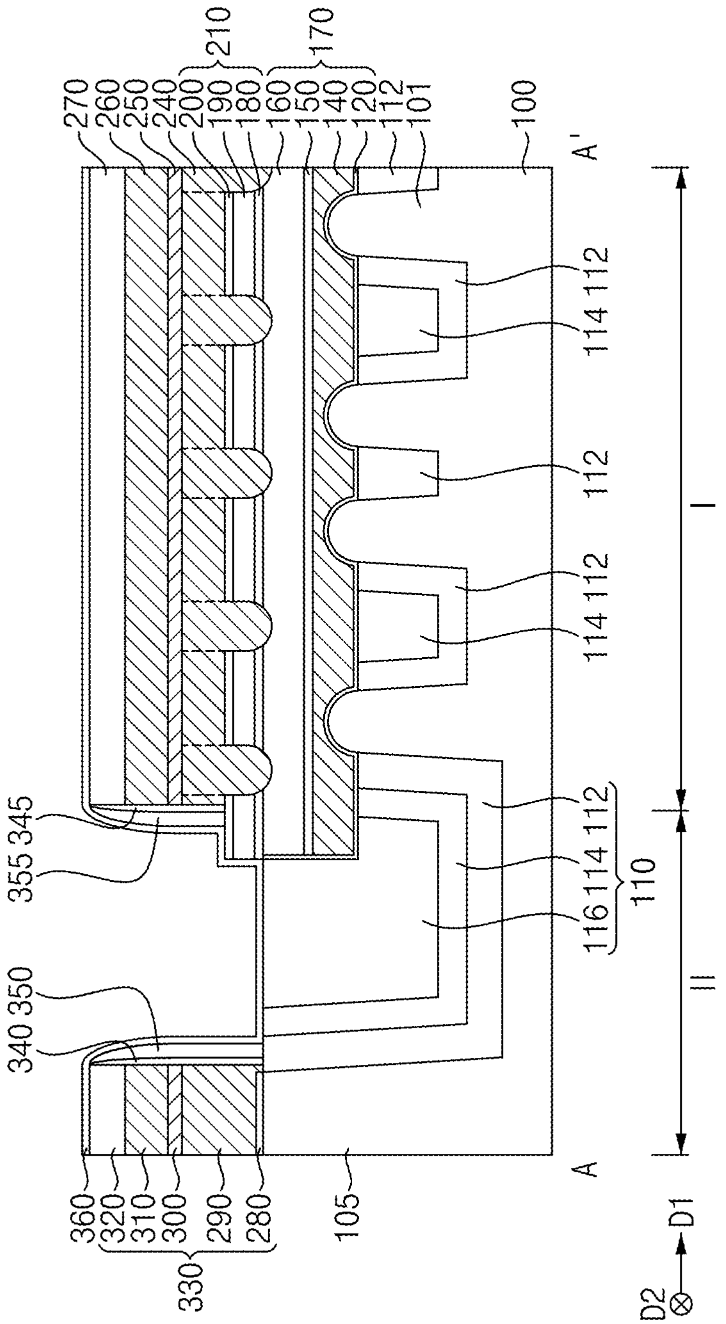
Figure 15:
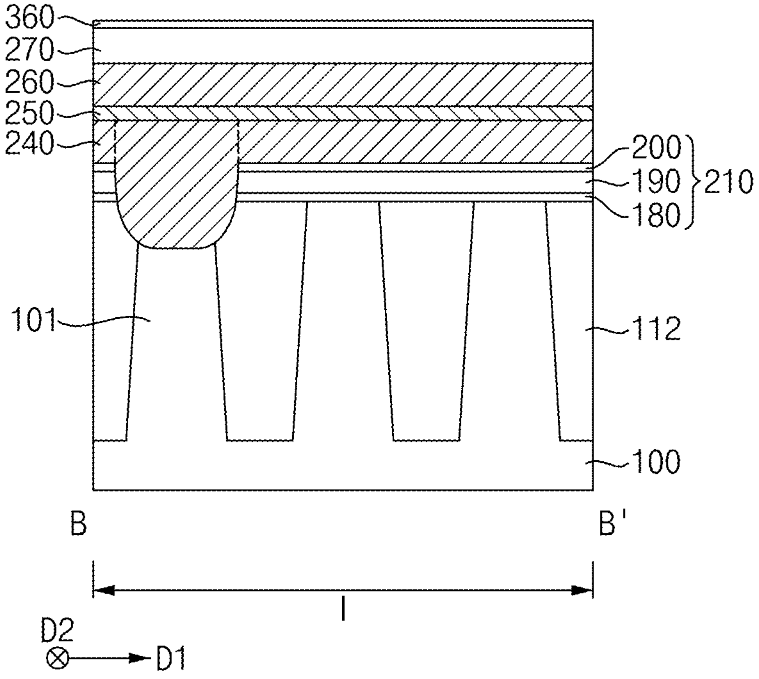
Figure 16:
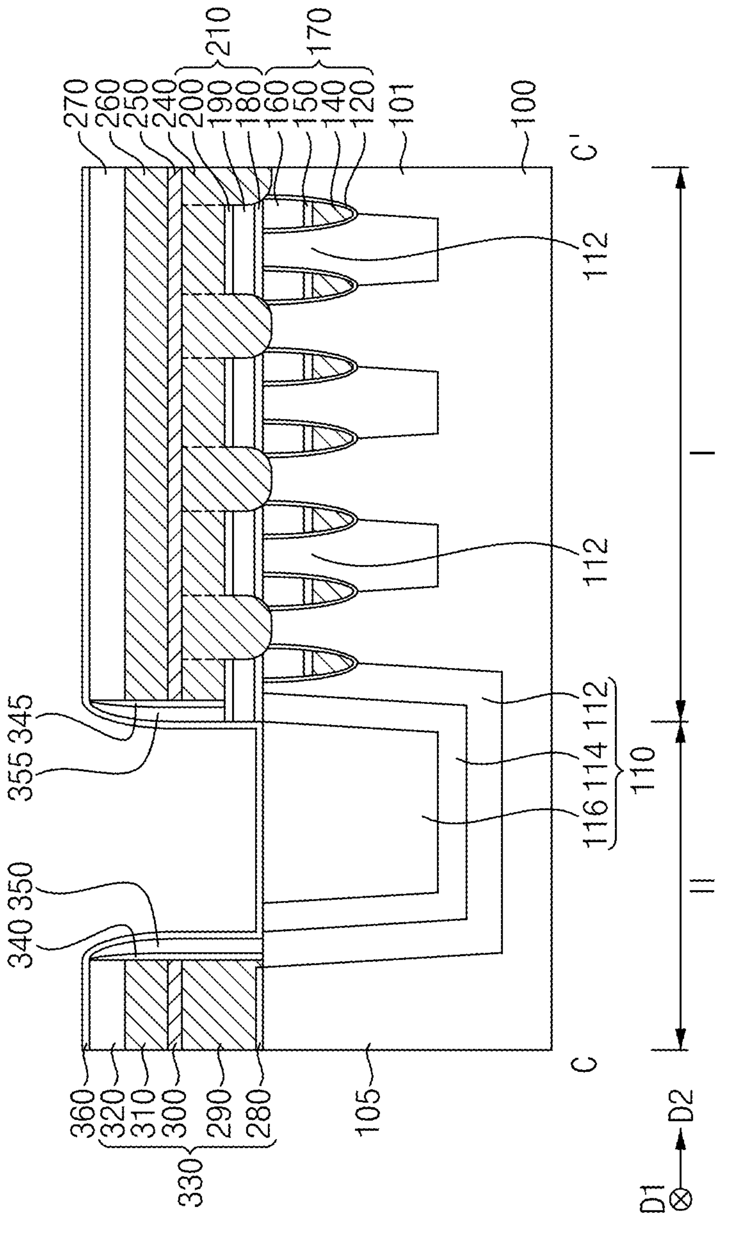

Referring to FIGS. 11 and 12, a third conductive layer 240, a second barrier layer 250, a fourth conductive layer 260 and a second mask layer 270 may be sequentially stacked on the insulation layer structure 210, the upper surfaces of the first active pattern 101, the isolation structure 110 and the first gate structure 170 exposed by the first opening 230 on the first region I of the substrate 100, and the second gate insulation layer 220 and the isolation structure 110 on the second region II of the substrate 100, which may collectively form a conductive structure layer. The third conductive layer 240 may fill the first opening 230.

The third conductive layer 240 may include doped polysilicon, the second barrier layer 250 may include a metal silicon nitride, e.g., titanium silicon nitride, the fourth conductive layer 260 may include a metal, e.g., tungsten, and the second mask layer 270 may include a nitride, e.g., silicon nitride.

Referring to FIGS. 13 to 16, the conductive structure layer may be patterned to form a second gate structure 330 on the second region II of the substrate 100.

The second gate structure 330 may include a second gate insulation pattern 280, a third conductive pattern 290, a second barrier pattern 300, a fourth conductive pattern 310 and a second gate mask 320 sequentially stacked in the vertical direction substantially perpendicular to an upper surface of the substrate 100, and the third conductive pattern 290, the second barrier pattern 300 and the fourth conductive pattern 310 may collectively form a second gate electrode.

The second gate structure 330 may at least partially overlap the second active pattern 105 in the vertical direction on the second region II of the substrate 100.

A portion of the conductive structure layer on an edge portion of the first region I of the substrate 100 adjacent to the second region II of the substrate 100 may also be removed, and thus the insulation layer structure 210, and the upper surfaces of the first active pattern 101, the isolation structure 110 and the first gate structure 170 exposed by the first opening 230 may also be partially exposed.

A first spacer structure may be formed on a sidewall of the second gate structure 330, and a second spacer structure may be formed on a sidewall of the conductive structure layer remaining on the first region I of the substrate 100. The first spacer structure may include first and third spacers 340 and 350 stacked on the sidewall of the second gate structure 330 in a horizontal direction substantially parallel to the upper surface of the substrate 100, and the second spacer structure may include second and fourth spacers 345 and 355 stacked on the sidewall of the conductive structure layer in the horizontal direction.

The first and second spacers 340 and 345 may be formed by forming a first spacer layer on the substrate 100 to cover the conductive structure layer and the second gate structure 330 and anisotropically etching the first spacer layer. The third and fourth spacers 350 and 355 may be formed by forming a second spacer layer on the substrate 100 to cover the conductive structure layer, the second gate structure 330 and the first and second spacers 340 and 345 and anisotropically etching the second spacer layer.

The first and second spacers 340 and 345 may include a nitride, e.g., silicon nitride, and the third and fourth spacers 350 and 355 may include an oxide, e.g., silicon oxide.

However, the structure of the first and second spacer structures may not be limited thereto, and each of the first and second spacer structures may include a single spacer or more than two spacers sequentially stacked.

A first etch stop layer 360 may be formed on the substrate 100 to cover the conductive structure layer, the second gate structure 330, the first and second spacer structures, and the isolation structure 110. The first etch stop layer 360 may include a nitride, e.g., silicon nitride.

Figure 17:
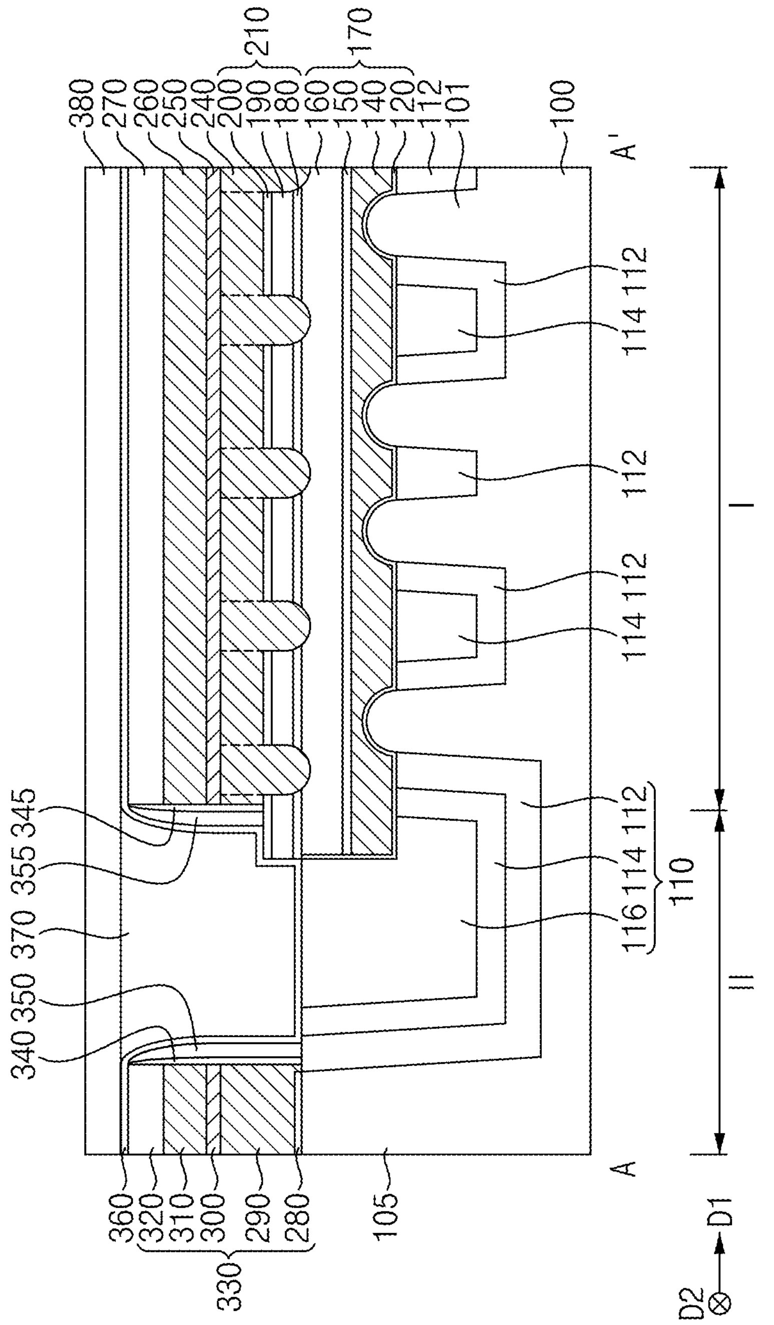
Figure 18:
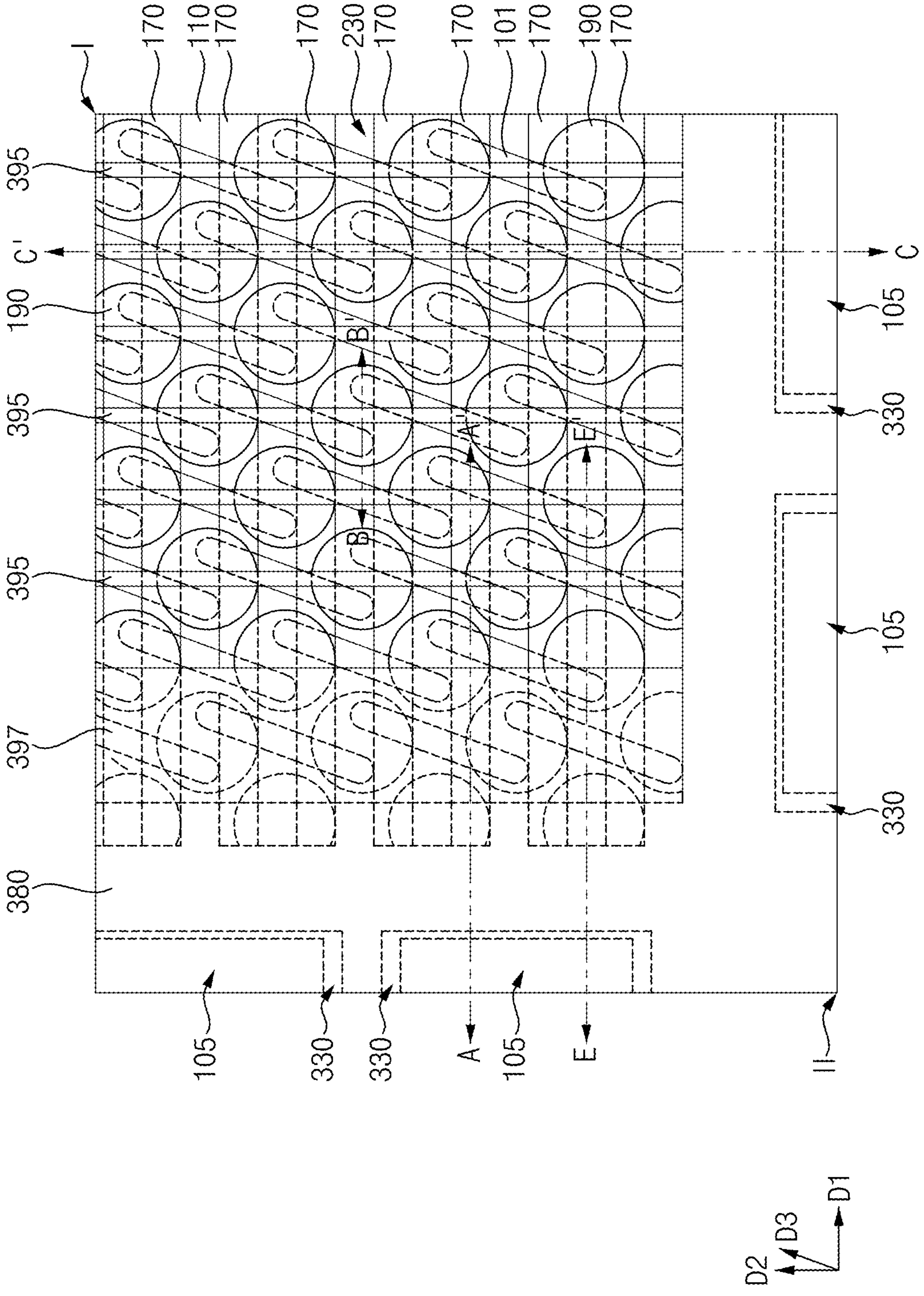
Figure 19:
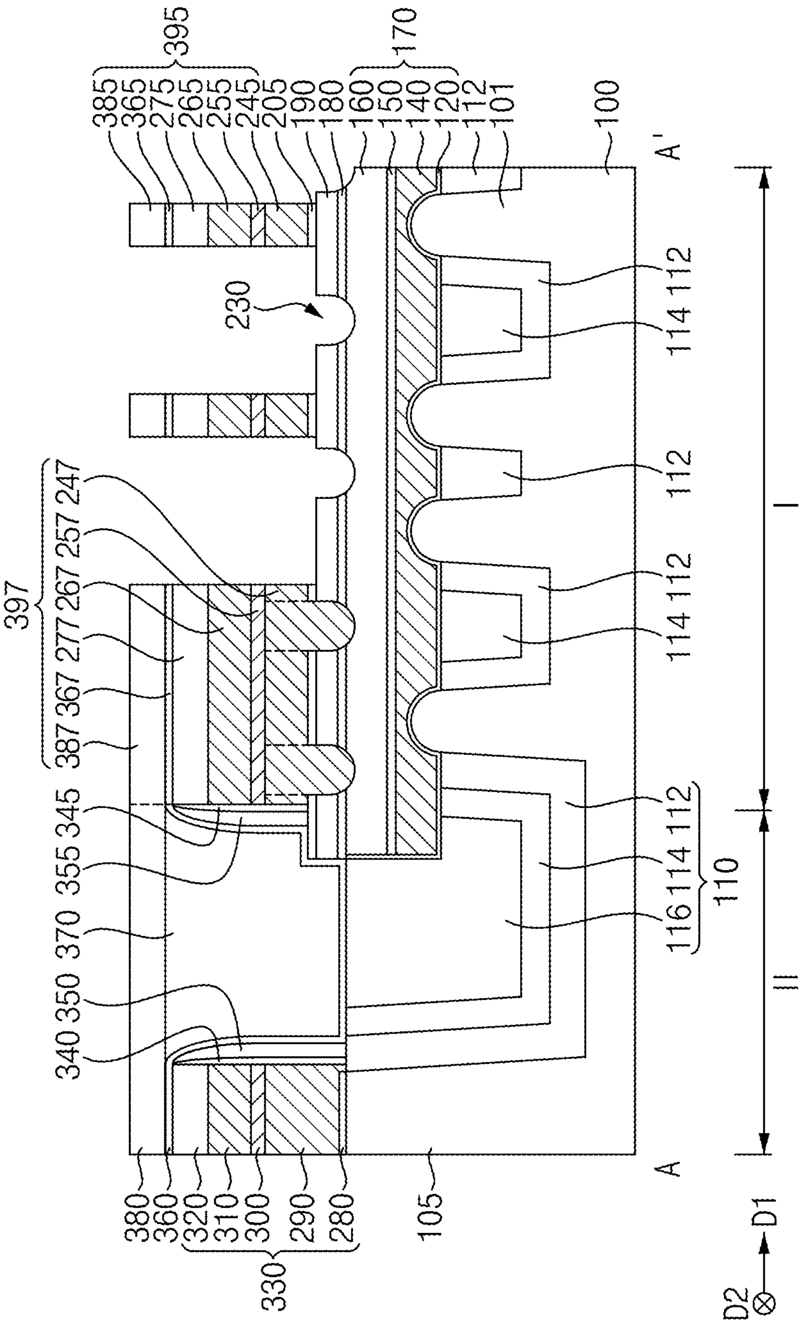
Figure 20:
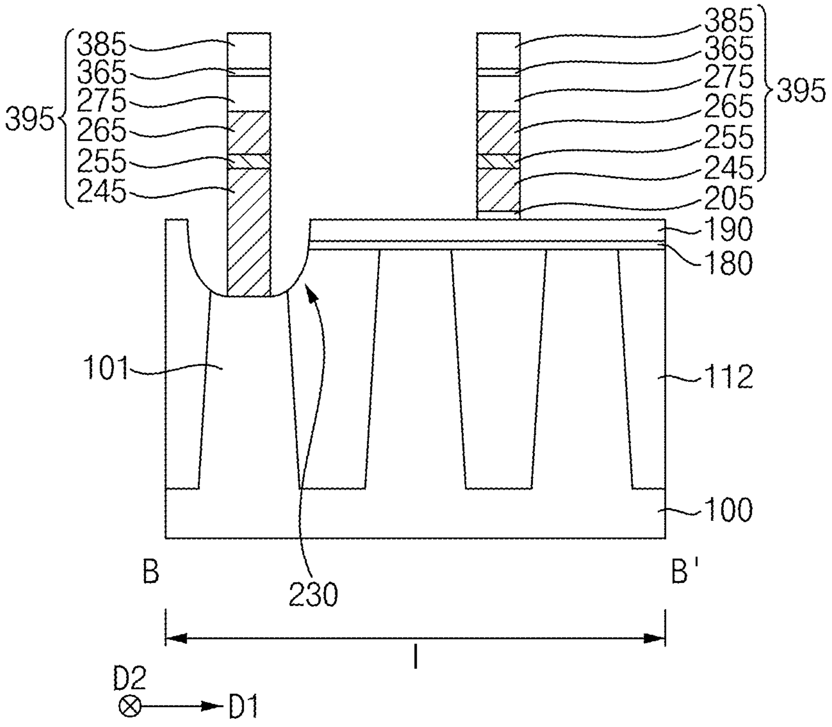
Figure 21:
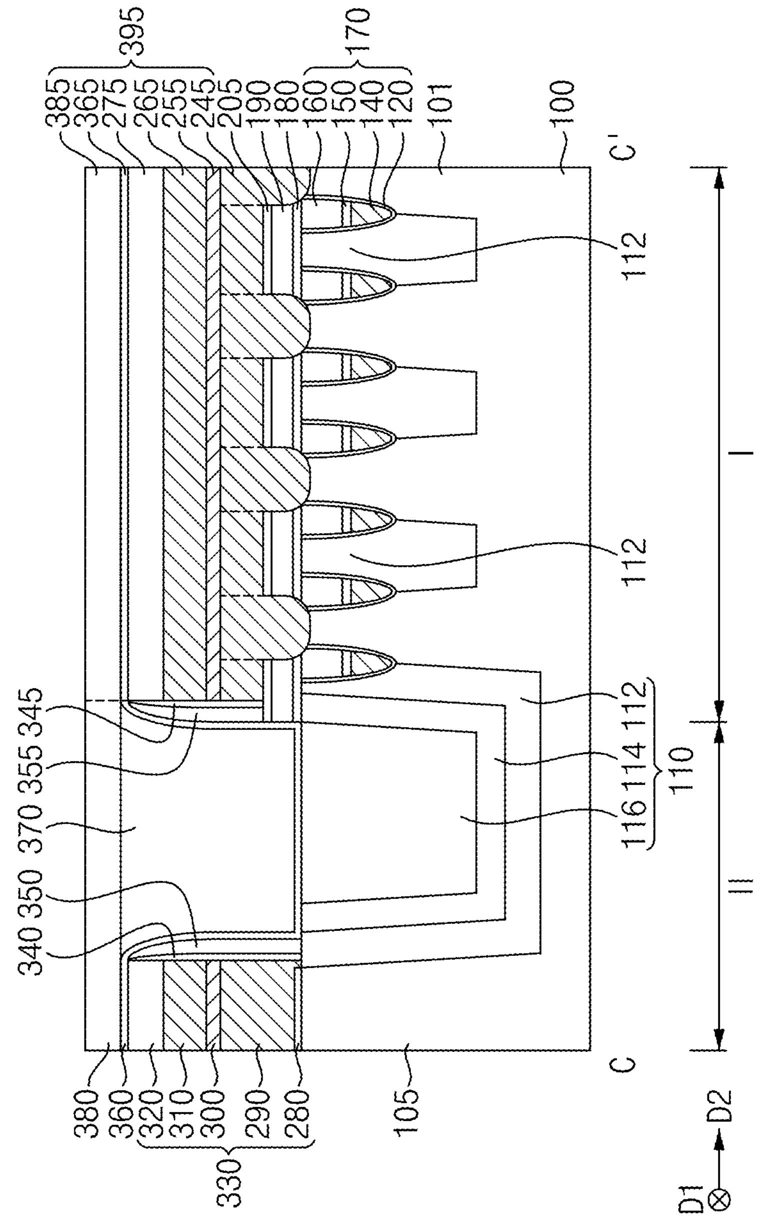

Referring to FIG. 17, a first insulating interlayer 370 may be formed on the first etch stop layer 360 to a sufficient height, the first insulating interlayer 370 may be planarized until an upper surface of the second gate structure 330 and an upper surface of a portion of the first etch stop layer 360 on the conductive structure layer are exposed, and a capping layer 380 may be formed on the first insulating interlayer 370 and the first etch stop layer 360.

Thus, the first insulating interlayer 370 may fill a space between the first spacer structures on the sidewall of the second gate structures 330, and a space between the first spacer structure on the sidewall of the second gate structure 330 and the second spacer structure on the sidewall of the conductive structure layer.

The first insulating interlayer 370 may include an oxide, e.g., silicon oxide, and the capping layer 380 may include a nitride, e.g., silicon nitride.

Referring to FIGS. 18 to 21, a portion of the capping layer 380 on the first region I of the substrate 100 may be etched to form a first capping pattern 385, and the first etch stop layer 360, the second mask layer 270, the fourth conductive layer 260, the second barrier layer 250 and the third conductive layer 240 may be sequentially etched using the first capping pattern 385 as an etching mask.

In example embodiments, the first capping pattern 385 may extend in the second direction D2 on the first region I of the substrate 100, and a plurality of first capping patterns 385 may be formed to be spaced apart from each other in the first direction D1. The capping layer 380 may remain on the second region II of the substrate 100.

By the etching process, on the first region I of the substrate 100, a fifth conductive pattern 245, a third barrier pattern 255, a sixth conductive pattern 265, a second mask 275, a first etch stop pattern 365 and the first capping pattern 385 may be sequentially stacked on the first opening 230, and a third insulation pattern 205, the fifth conductive pattern 245, the third barrier pattern 255, the sixth conductive pattern 265, the second mask 275, the first etch stop pattern 365 and the first capping pattern 385 may be sequentially stacked on the second insulation layer 190 of the insulation layer structure 210 at an outside of the first opening 230.

Hereinafter, the fifth conductive pattern 245, the third barrier pattern 255, the sixth conductive pattern 265, the second mask 275, the first etch stop pattern 365 and the first capping pattern 385 sequentially stacked may be referred to as a bit line structure 395. In example embodiments, the bit line structure 395 may extend in the second direction D2 on the first region I of the substrate 100, and a plurality of bit line structures 395 may be spaced apart from each other in the first direction D1.

A dummy bit line structure 397 including a seventh conductive pattern 247, a fourth barrier pattern 257, an eighth conductive pattern 267, a third mask 277, a second etch stop pattern 367 and a second capping pattern 387 sequentially stacked and extending in the second direction D2 may be formed on a portion of the first region I of the substrate 100 adjacent to the second region II of the substrate 100 in the first direction D1, and the first etch stop layer 360 may remain on the second gate structure 330, the first and second spacer structures, a portion of the insulation layer structure 210, the second active pattern 105 and the isolation structure 110. Additionally, the capping layer 380 may remain on portions of the first etch stop layer 360 on an upper surface of the second gate structure 330 and the first insulating interlayer 370.

Figure 22:
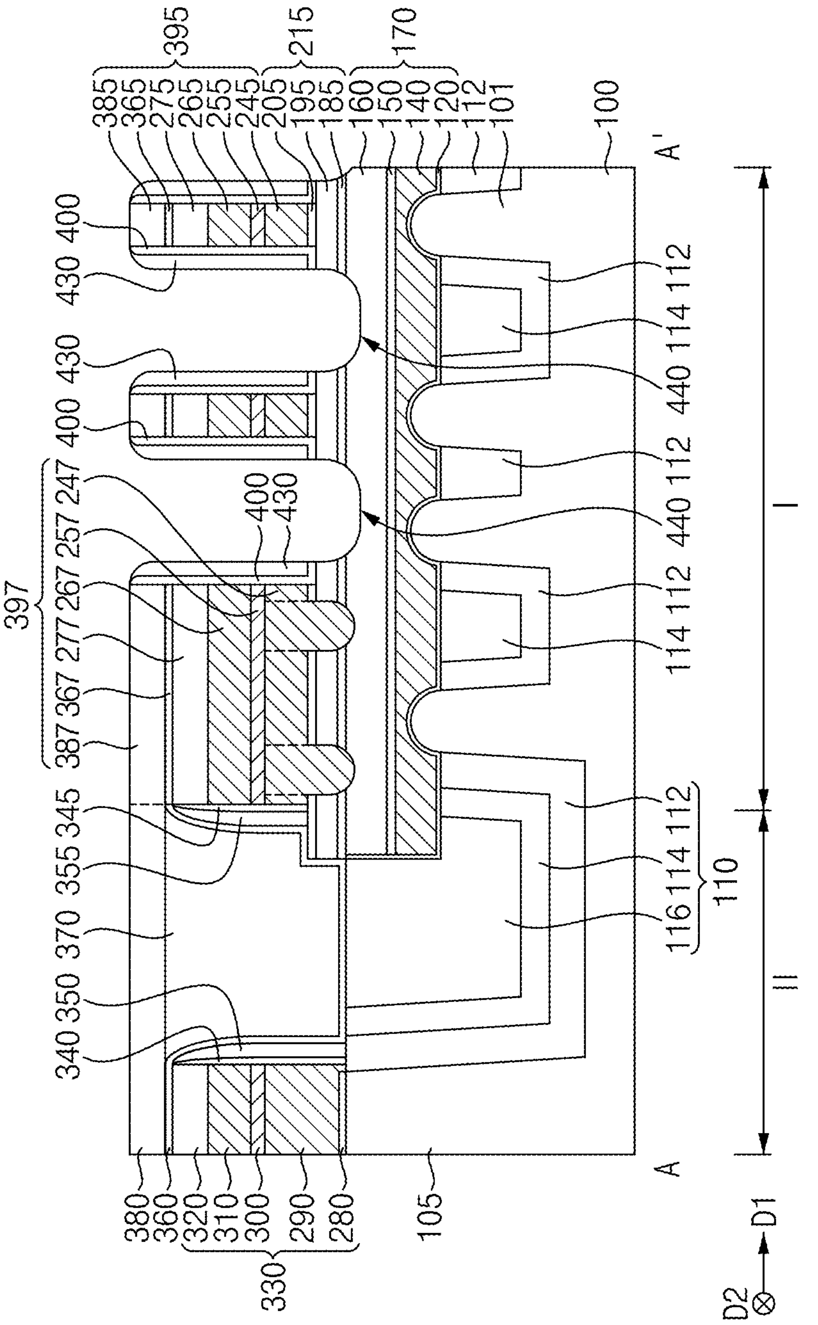
Figure 23:
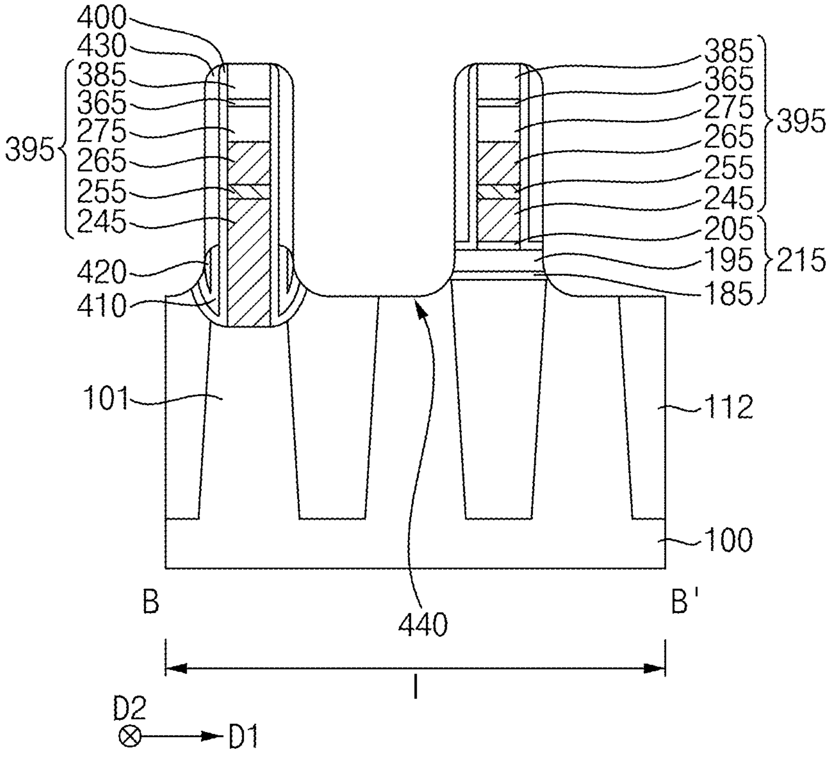

Referring to FIGS. 22 and 23, a fifth spacer layer may be formed on the substrate 100 to cover the bit line structure 395, the dummy bit line structure 397 and the capping layer 380, and fourth and fifth insulation layers may be sequentially formed on the fifth spacer layer.

The fifth spacer layer may also cover a sidewall of the third insulation pattern 205 between the second insulation layer 190 and the bit line structure 395, and the fifth insulation layer may fill the first opening 230.

The fifth spacer layer may include a nitride, e.g., silicon nitride, the fourth insulation layer may include an oxide, e.g., silicon oxide, and the fifth insulation layer may include a nitride, e.g., silicon nitride.

The fourth and fifth insulation layers may be etched by an etching process. In example embodiments, the etching process may be performed by a wet etch process using an etching solution including phosphorous acid ($H_3PO_4$), SC1, hydrogen fluoride (HF), and other portions of the fourth and fifth insulation layers except for a portion in the first opening 230 may be removed. Thus, most of an entire surface of the fifth spacer layer, that is, an entire surface except for a portion thereof in the first opening 230 may be exposed, and portions of the fourth and fifth insulation layers remaining in the first opening 230 may form fourth and fifth insulation patterns 410 and 420, respectively.

A sixth spacer layer may be formed on the exposed surface of the fifth spacer layer and the fourth and fifth insulation patterns 410 and 420 in the first opening 230, and may be anisotropically etched to form a sixth spacer 430 on the surface of the fifth spacer layer and the fourth and fifth insulation patterns 410 and 420 to cover a sidewall of the bit line structure 395. The sixth spacer layer may also be formed on a sidewall of the dummy bit line structure 397. The sixth spacer layer may include an oxide, e.g., silicon oxide.

A dry etching process may be performed to form a second opening 440 exposing the upper surface of the first active pattern 101. An upper surface of the isolation structure 110 and an upper surface of the first gate mask 160 may also be exposed by the second opening 440.

By the dry etching process, portions of the fifth spacer layer on upper surfaces of the first and second capping patterns 385 and 387, the second insulation layer 190 and the capping layer 380 may be removed, and thus a fifth spacer 400 covering the sidewall of the bit line structure 395 may be formed. The fifth spacer 400 may also cover the sidewall of the dummy bit line structure 397.

Additionally, during the dry etching process, the first and second insulation layers 180 and 190 may be partially removed, such that first and second insulation patterns 185 and 195 may remain under the bit line structure 395. The first to third insulation patterns 185, 195 and 205 that are sequentially stacked under the bit line structure 395 may collectively form an insulation pattern structure 215.

Figure 24:
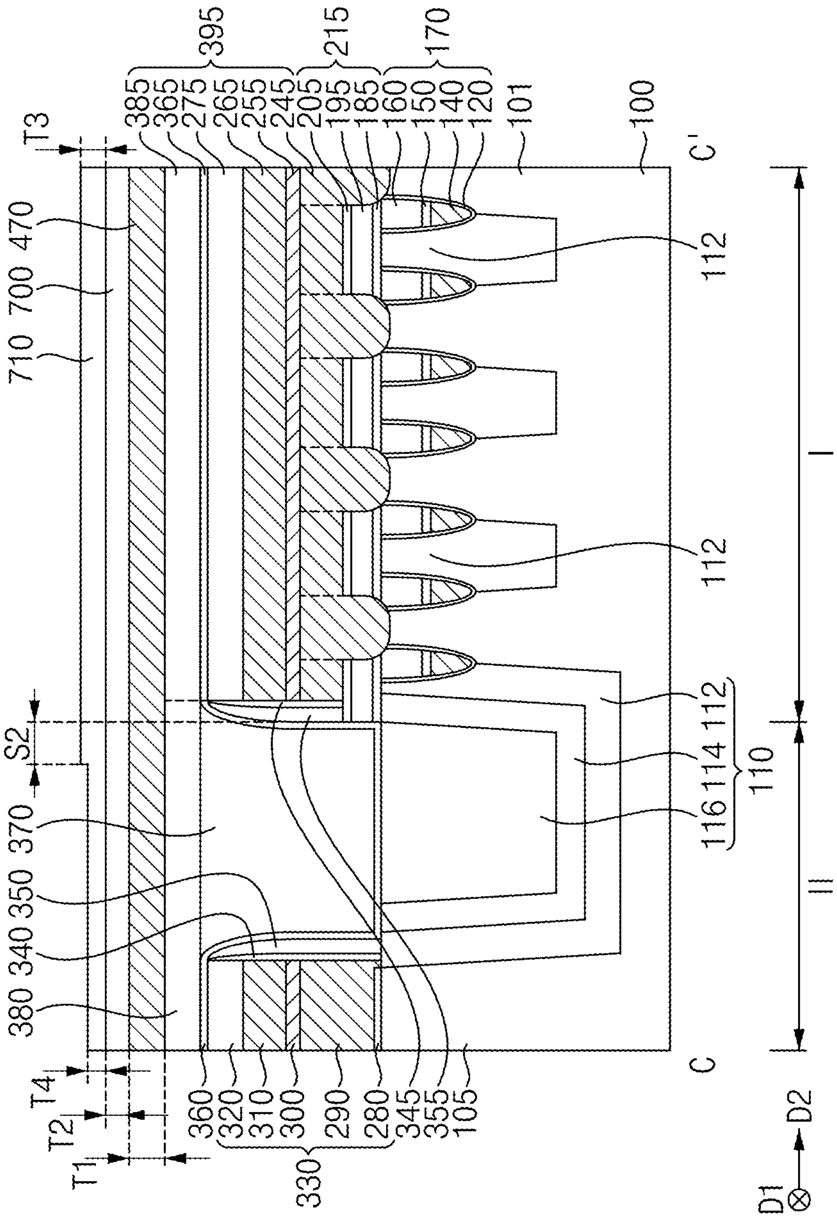
Figure 25:
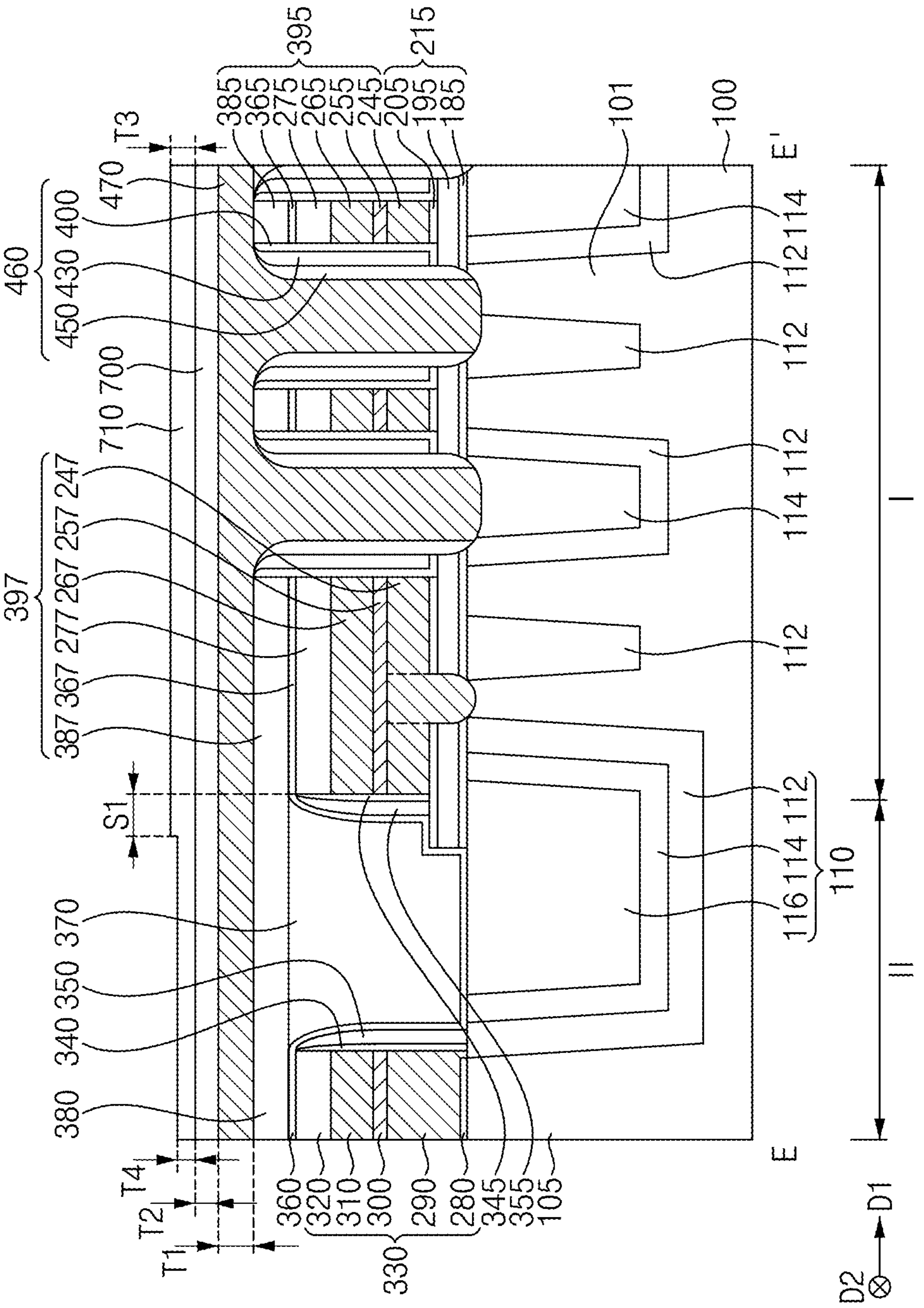

Referring to FIGS. 24 and 25, a seventh spacer layer may be formed on the upper surface of the first and second capping patterns 385 and 387, the upper surface of the capping layer 380, an outer sidewall of the sixth spacer 430, portions of upper surfaces of the fourth and fifth insulation patterns 410 and 420, and the upper surfaces of the first active pattern 101, the isolation structure 110 and the first gate mask 160 exposed by the second opening 440, and may be anisotropically etched to form a seventh spacer 450 covering an outer sidewall of sixth spacer 430 on the sidewalls of the bit line structure 395 and the dummy bit line structure 397. The seventh spacer layer may include a nitride, e.g., silicon nitride.

The fifth to seventh spacers 400, 430 and 450 sequentially stacked in the horizontal direction from the sidewall of the bit line structure 395 on the first region I of the substrate 100 may be referred to as a preliminary third spacer structure 460.

A preliminary lower contact plug layer 470 may be formed on the first region I of the substrate 100 to fill the second opening 440, and first and second reflective layers 700 and 710 may be stacked on the preliminary lower contact plug layer 470.

In example embodiments, the preliminary lower contact plug layer 470 may include amorphous silicon doped with, e.g., n-type impurities, and may have a first refractive index $n_1$.

Each of the first and second reflective layers 700 and 710 may adjust reflectivity of light incident on the first and second regions I and II of the substrate 100, and the first and second reflective layers 700 and 710 may collectively form a reflective layer structure. However, the first and second reflective layers 700 and 710 may also be referred to as first and second anti-reflective layers 700 and 710, respectively, which may collectively form an anti-reflective layer structure. In example embodiments, the first reflective layer 700 may include a material having a relatively low reflectivity (hereinafter, referred to as a second refractive index $n_2$), e.g., silicon oxide, tetraethyl orthosilicate (TEOS), etc., and the second reflective layer 710 may include a material having a relatively high reflectivity (hereinafter, referred to as a third refractive index $n_3$), e.g., silicon nitride, hafnium oxide, etc.

The preliminary lower contact plug layer 470 may have a first thickness T1 in the vertical direction from an upper surface of the capping layer 380 on the second region II of the substrate 100, and the first and second reflective layers 700 and 710 may have second and third thicknesses T2 and T3 in the vertical direction.

In example embodiments, the first thickness T1 of the preliminary lower contact plug layer 470 may satisfy Equation 1.

$$(N/2+1/8+\Delta)\lambda/n_1+\delta_1 \le T1 \le (N/2+3/8+\Delta)\lambda/n_1+\delta_2 \quad \text{<Equation 1>}$$

N is one of 1, 2 and 3, λ is a wavelength of an incident light, Δ is an optical path correction factor, $-1/4 \le \Delta \le 1/4$, each of $\delta_1$ and $\delta_2$ is a thickness correction factor, and $-8\ \text{nm} \le \delta_1 \le 8\ \text{nm}$, $-8\ \text{nm} \le \delta_2 \le 8\ \text{nm}$.

Each of Δ, $\delta_1$ and $\delta_2$ may have an optimal value according to process conditions.

For example, λ has a wavelength of about 532 nm, and $n_1$ has a value of about 4.8. If N is 1, then $\Delta=-1/8$, $\delta_1=2$ nm, $\delta_2=2$ nm, and $57\ \text{nm} \le \mathbf{T1} \le 85$. If N is 2, then $\Delta=-1/4$, $\delta_1=-8$ nm, $\delta_1=8$ nm, and $89\ \text{nm} \le \mathbf{T1} \le 133$ nm. If N is 3, then $\Delta=-1/8$, $\delta_1=2$ nm, $\delta_1=2$ nm, and $168\ \text{nm} \le \mathbf{T1} \le 196$ nm.

An upper portion of a portion of the second reflective layer 710 on the second region II of the substrate 100 may be removed by an etching process, and thus the portion of the second reflective layer 710 on the second region II of the substrate 100 may have a fourth thickness T4 less than the third thickness T3.

In example embodiments, the second and fourth thicknesses T2 and T4 may satisfy Equation 2.

$$n_2 * T2 = n_3 * T4 = \lambda/4 \quad \text{<Equation 2>}$$

However, the second and fourth thicknesses T2 and T4 may satisfy Equation 3 including an optical path correction factor according to process conditions.

$$T2 = (1/4+\Delta)\lambda/n_2 \quad \text{<Equation 3>}$$
$$T4 = (1/4+\Delta)\lambda/n_3$$
$$(-1/8 \le \Delta \le 1/8)$$

Likewise, the third thickness T3 may satisfy Equation 4.

$$T3 = (1/4+\Delta)\lambda/n_3 \quad \text{< Equation 4 >}$$
$$(-1/4 \le \Delta \le 1/4)$$

If a light is incident on the first and second reflective layers 700 and 710 stacked on the preliminary lower contact plug layer 470, the light is reflected at an interface between the first and second reflective layers 700 and 710, and a constructive interference occurs between the incident light and the reflective light due to the optical path difference between the incident light and the reflective light. In this case, the second to fourth thicknesses T2, T3 and T4 may satisfy Equations 3 and 4.

The optical path correction factor A in Equations 3 and 4 may have different values when calculating the second to fourth thicknesses T2, T3 and T4, according to densities, dispositions and process conditions of structures under the first and second reflective layers 700 and 710.

For example, λ may be about 532 nm, $n_2$ may be about 1.46, and $n_3$ may be about 2.2. If Δ=0 in Equation 3 and Δ=3/20 in Equation 4, then T2=91 nm, T3=97 nm and T4=60 nm.

In an example embodiment, the third thickness T3 may satisfy Equation 5.

$$\lambda/(10*n_3) \leq T3 \leq 9\lambda/(10*n_3)$$ <Equation 5>

Thus, if λ is about 532 nm and $n_3$ is about 2.2, then 24 nm≤T3≤218 nm. However, Equation 5 shows a maximum range of the third thickness T3, and a real value of the third thickness T3 may be determined by Equation 4 in the maximum range thereof, for example, 87 nm≤T3≤107.

In example embodiments, a portion of the second reflective layer 710 on a portion of the second region II of the substrate 100 adjacent to the first region I may not be etched by the etching process. An end portion in the first direction D1 of a portion of the second reflective layer 710 maintaining the third thickness T3 may be spaced apart by a first distance S1 from a boundary in the first direction D1 of the first region I of the substrate 100, and an end portion in the second direction D2 of the portion of the second reflective layer 710 maintaining the third thickness T3 may be spaced apart by a second distance S2 from a boundary in the second direction D2 of the first region I of the substrate 100.

In an example embodiment, the first and second distances S1 and S2 may be substantially the same as each other. Alternatively, the first and second distances S1 and S2 may be different from each other. In example embodiments, each of the first and second distances S1 and S2 may be less than about 500 nm, preferably, in a range of about 300 nm to about 400 nm.

Figure 26:
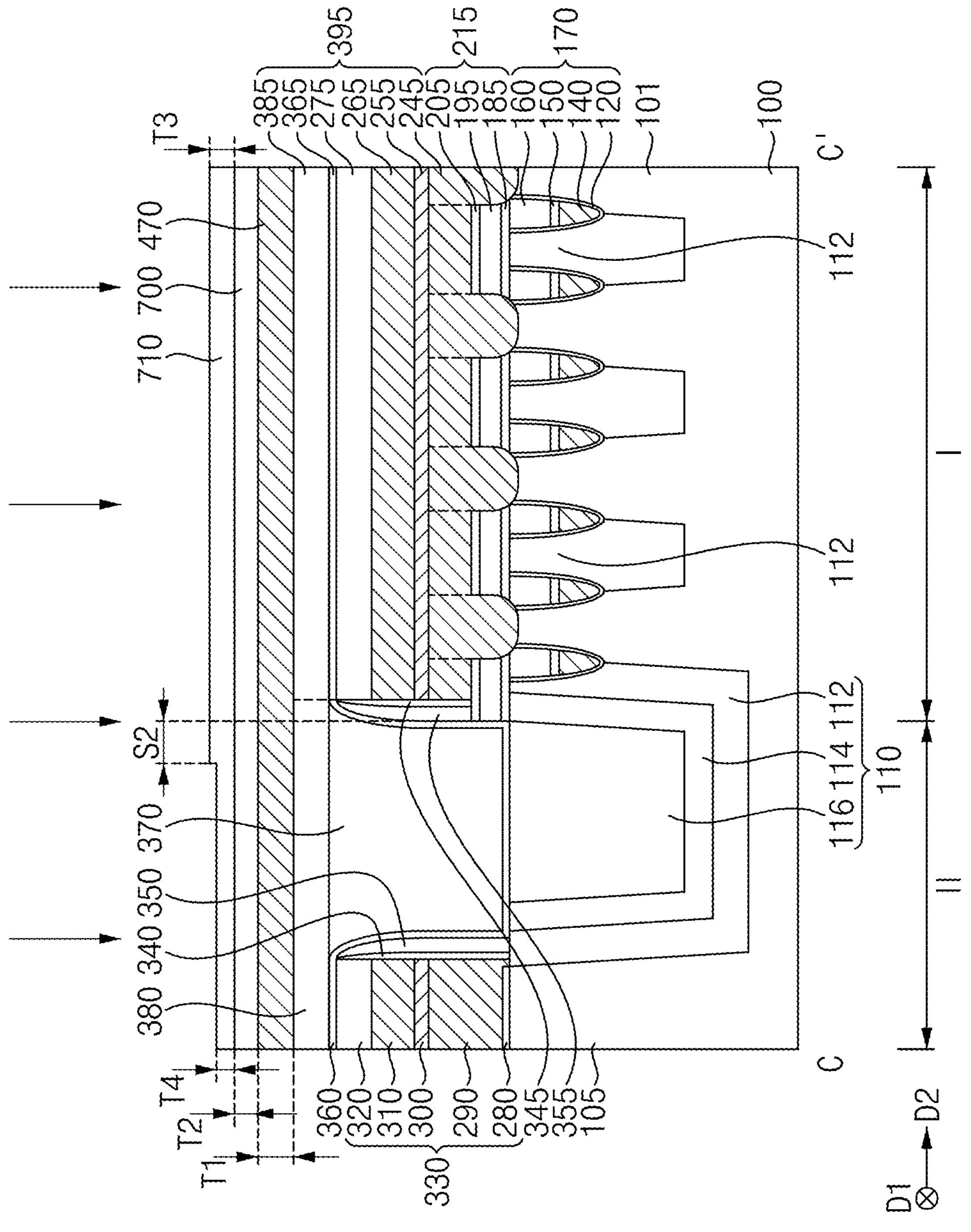
Figure 27:
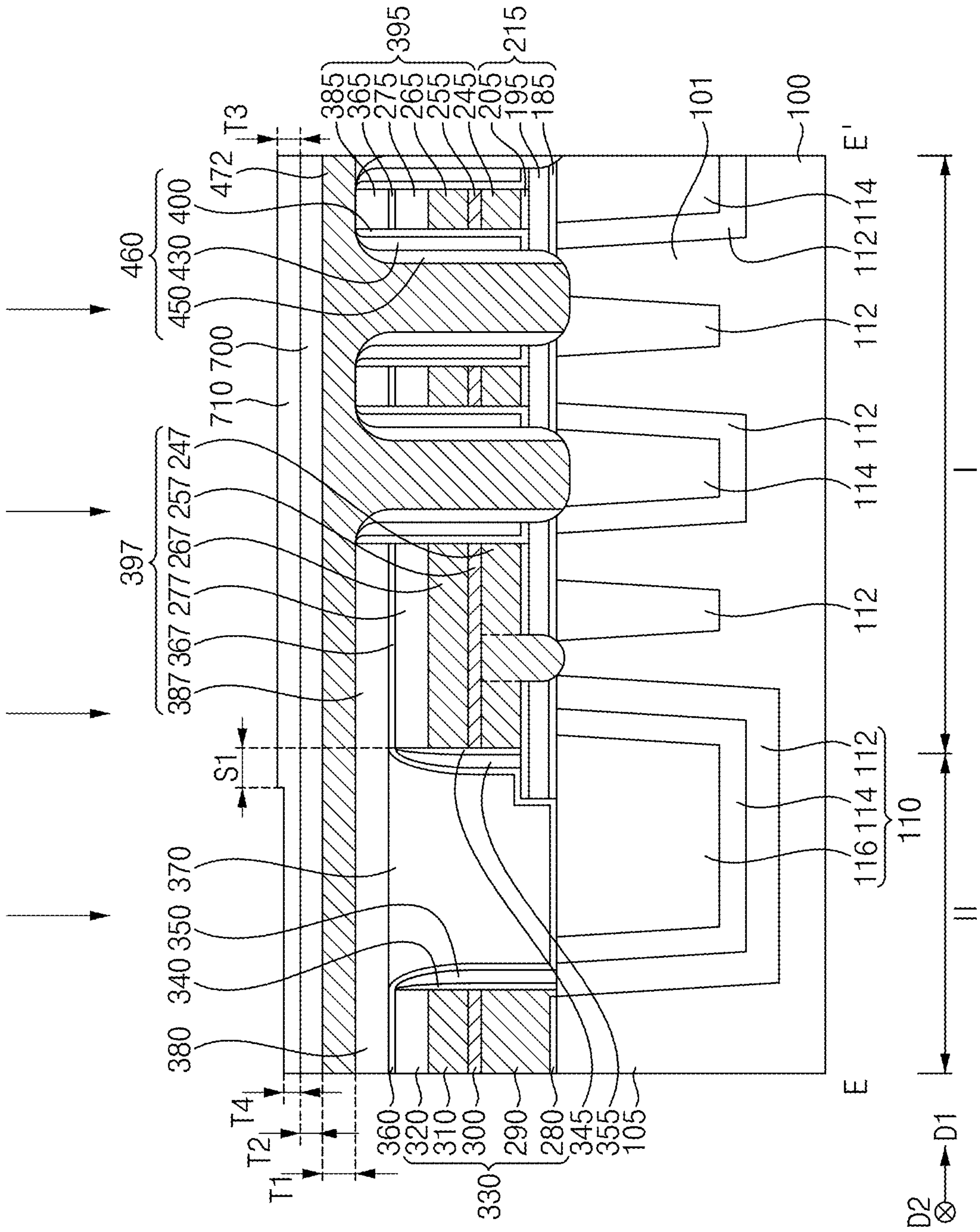
Figure 28:
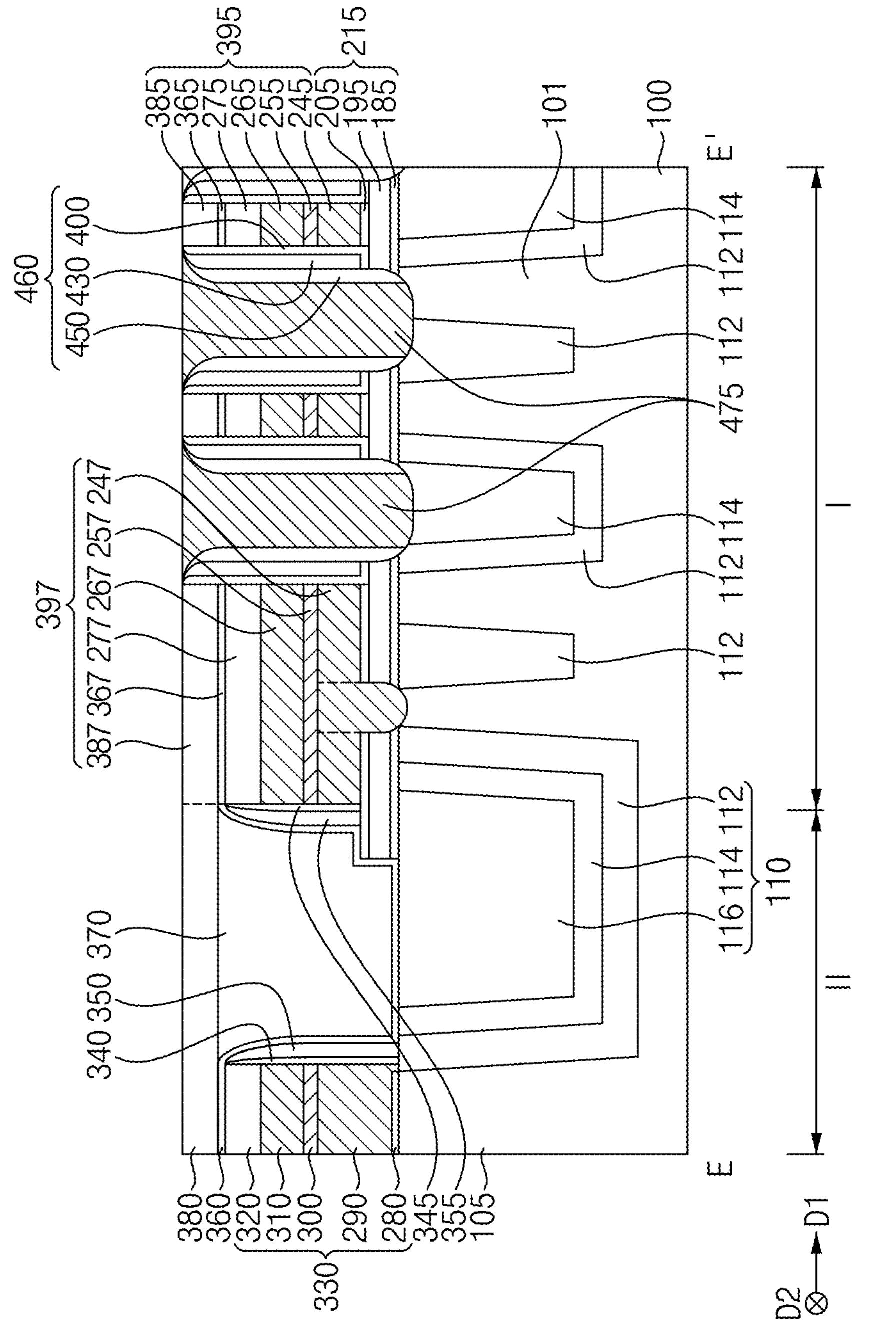

Referring to FIGS. 26 and 27, a melting laser annealing (MLA) process may be performed in which laser is irradiated on the first and second regions I and II of the substrate 100 having the first and second reflective layers 700 and 710 thereon, and thus the preliminary contact plug layer 470 including amorphous silicon doped with impurities may be crystallized to be converted into a lower contact plug layer 472 including polysilicon doped with impurities.

In example embodiments, the laser may have a wavelength of a visible light, e.g., a wavelength of about 400 nm to about 700 nm, and may include, for example, pulse laser, continuous wave (CW) laser, etc. In an example embodiment, the laser may have a power of about 200 $mJ/cm_2$ to about 1200 $mJ/cm_2$.

Referring to FIG. 28, after removing the first and second reflective layers 700 and 710, the lower contact plug layer 472 may be planarized until the upper surfaces of the capping layer 380 and the first and second capping patterns 385 and 387 to form a lower contact plug 475.

The lower contact plug 475 may extend in the second direction D2 between neighboring ones of the bit line structures 395 in the first direction D1 and between the bit line structure 395 and the dummy bit line structure 397 on the first region I of the substrate 100, and a plurality of lower contact plugs 475 may be spaced apart from each other in the first direction D1. Each of the lower contact plugs 475 may contact an upper surface of an end portion in the third direction D3 of the first active pattern 101 extending in the third direction D3.

Figure 29:
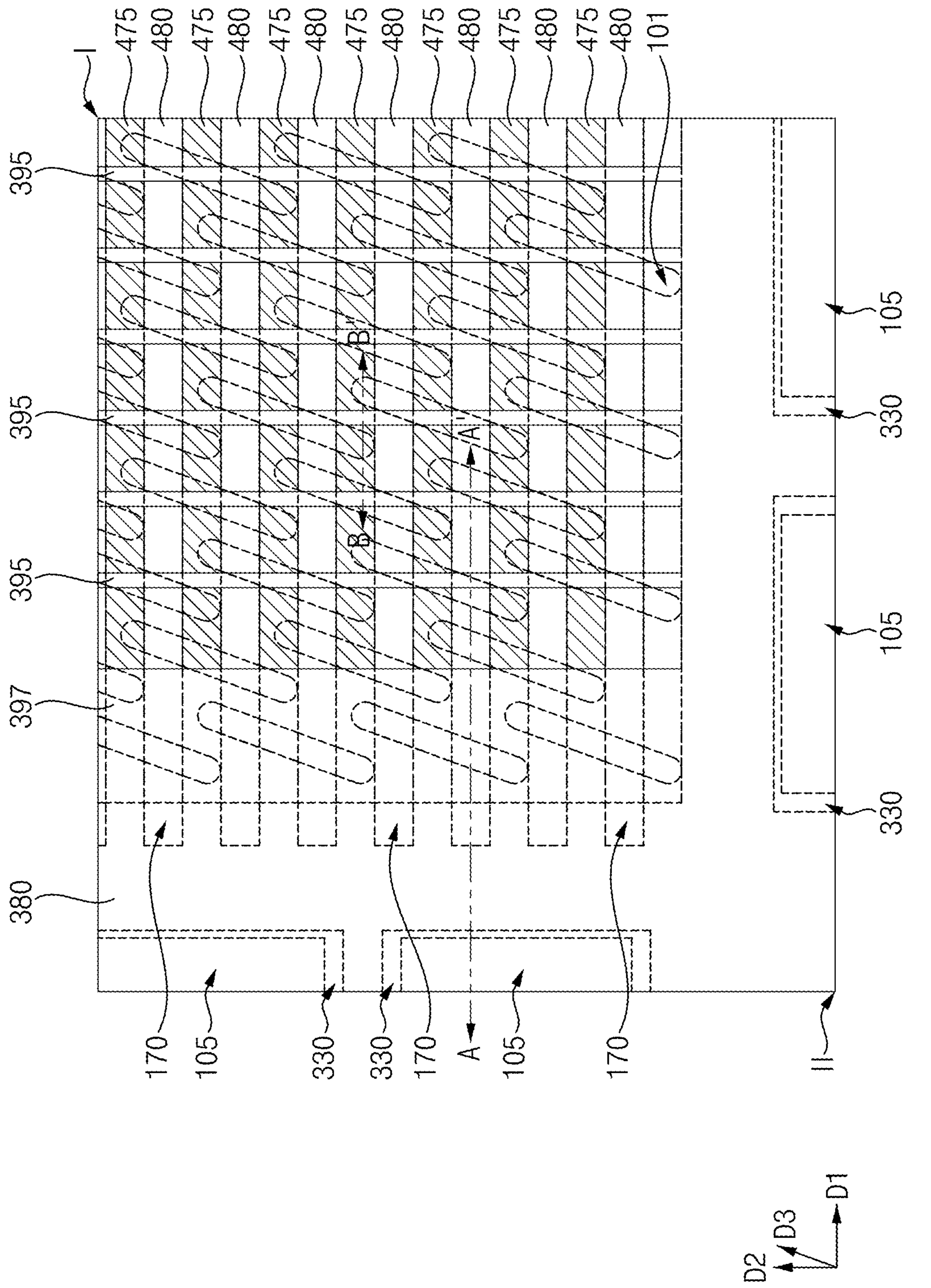
Figure 30:
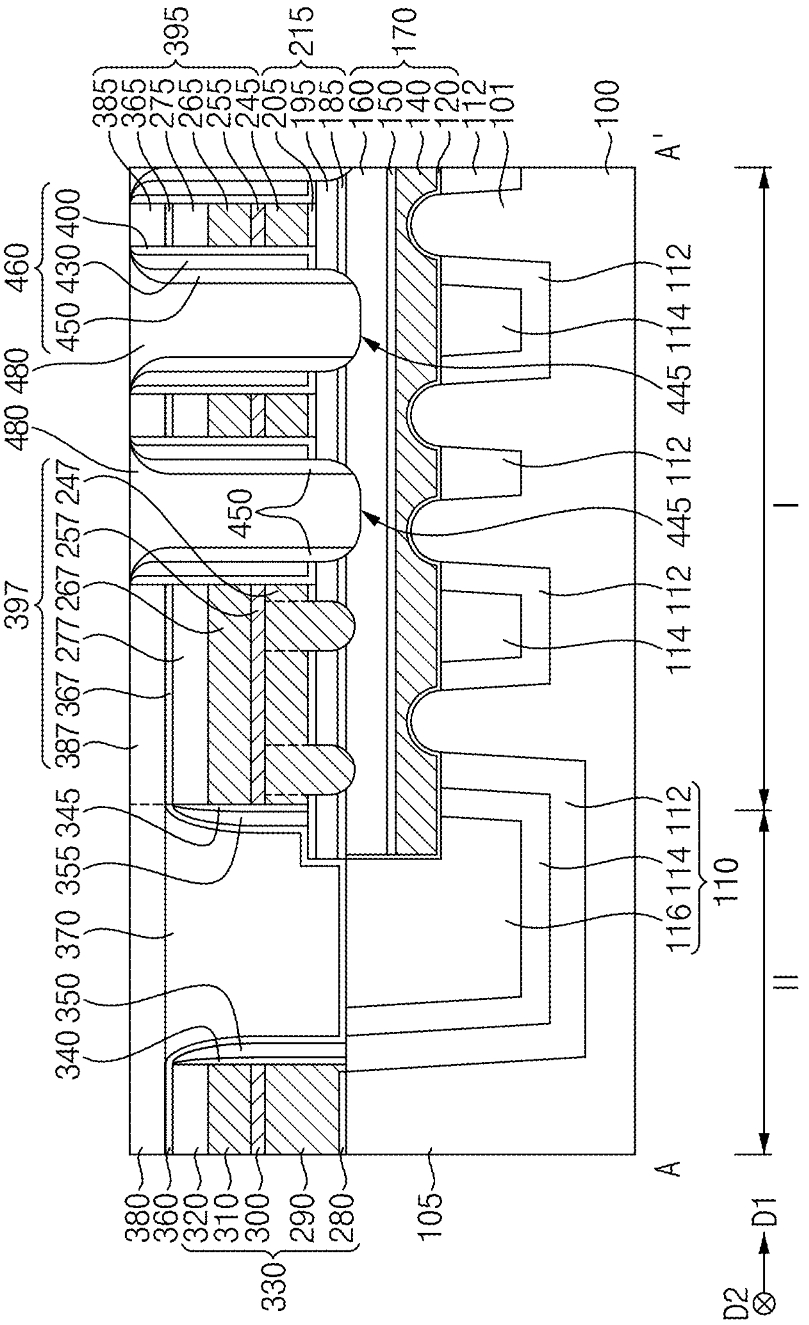
Figure 31:
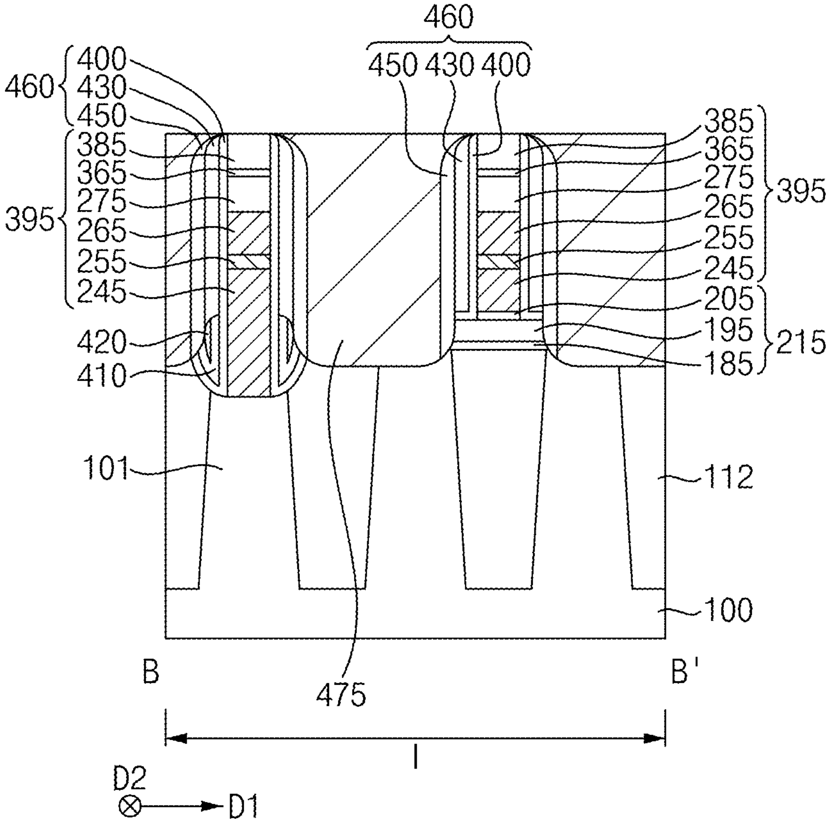

Referring to FIGS. 29 to 31, an etching mask having third openings, each of which may extend in the first direction D1, spaced apart from each other in the second direction D2 may be formed on the capping layer 380, the bit line structure 395, the dummy bit line structure and the lower contact plug layer, and an etching process may be performed on the lower contact plug 475 using the etching mask to form a fourth opening 445.

In example embodiments, the third opening may overlap the first gate structure 170 in the vertical direction, and the fourth opening 445 may expose an upper surface of the first gate mask 160 of the first gate structure 170. As the fourth opening 445 is formed, the lower contact plug 475 extending in the second direction D2 may be divided into a plurality of parts spaced apart from each other in the second direction D2.

After removing the etching mask, a fence pattern 480 may be formed to fill the fourth opening 445. A plurality of fence patterns 480 may be spaced apart from each other in the second direction D2 between the bit line structures 395 and between the bit line structure 395 and the dummy bit line structure 397. The fence pattern 480 may include a nitride, e.g., silicon nitride.

As illustrated above, the lower contact plugs 475 and the fence patterns 480 that may be alternately and repeatedly arranged in the second direction D2 may be formed by forming the preliminary lower contact plug layer 470 extending in the second direction D2 between the bit line structures 395, performing the MLA process to form the lower contact plug layer 472, planarizing the lower contact plug layer 472 to form the lower contact plug 475, forming the fourth openings 445 through the lower contact plug 475 that are spaced apart from each other in the second direction D2, and filling the fourth opening 445 by the fence pattern 480, however, the inventive concept may not be limited thereto.

Alternatively, the lower contact plugs 475 and the fence patterns 480 that may be alternately and repeatedly arranged in the second direction D2 may be formed by forming a fence layer extending in the second direction D2 between the bit line structures 395, forming fifth openings through the fence layer spaced apart from each other in the second direction D2 to divide the fence layer into the fence patterns 480, forming the preliminary lower contact plug layer 470 on the fence layer to fill the fifth openings, performing an MLA process on the preliminary lower contact plug layer 470 to form the lower contact plug layer 472, planarizing the lower contact plug layer 472 to form the lower contact plugs 475.

Alternatively, the lower contact plugs 475 and the fence patterns 480 that may be alternately and repeatedly arranged in the second direction D2 may be formed by forming a sacrificial layer including an oxide, e.g., silicon oxide and extending in the second direction D2 between the bit line structures 395, forming the fence patterns 480 through the sacrificial layer spaced apart from each other in the second direction D2, removing the sacrificial layer to form sixth openings, forming the preliminary lower contact plug layer 470 to fill the sixth openings, performing an MLA process on the preliminary lower contact plug layer 470, and planarizing the lower contact plug layer 472 to form the lower contact plugs 475.

Figure 32:
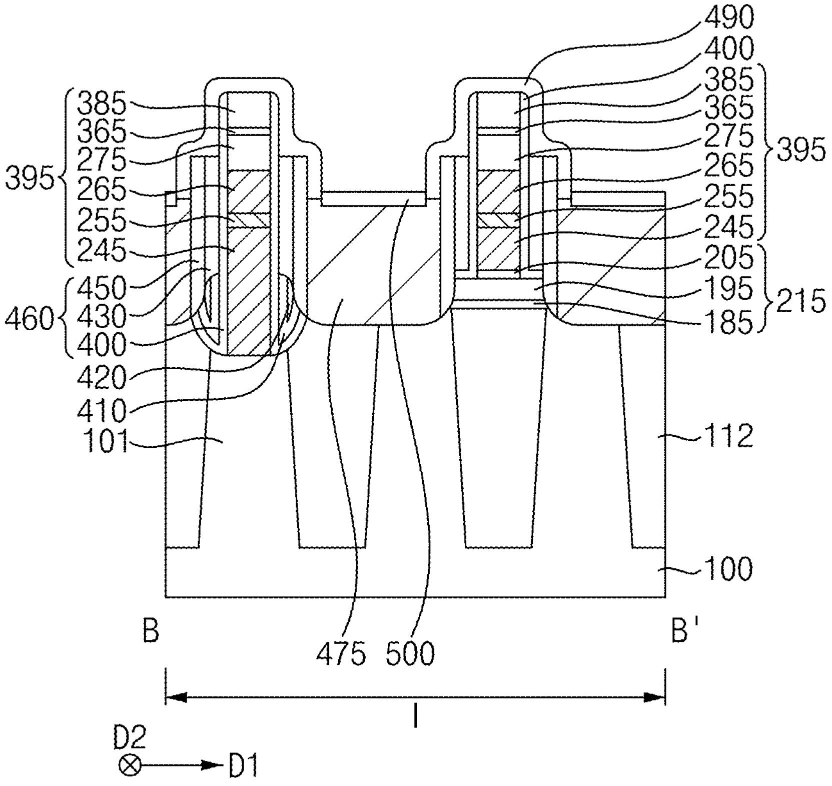

Referring to FIG. 32, an upper portion of the lower contact plug 475 may be removed to expose an upper portion of the preliminary third spacer structure 460 on the sidewalls of the bit line structure 395 and the dummy bit line structure 397, and upper portions of the sixth and seventh spacers 430 and 450 of the exposed preliminary third spacer structure 460 may be removed.

An etch back process may be further performed to remove an upper portion of the lower contact plug 475. Thus, an upper surface of the lower contact plug 475 may be lower than uppermost surfaces of the sixth and seventh spacers 430 and 450.

An eighth spacer layer may be formed on the bit line structure 395, the dummy bit line structure 397, the preliminary third spacer structure 460, the fence pattern 480, the capping layer 380, and the lower contact plug 475, and may be anisotropically etched so that an eighth spacer 490 may be formed to cover the preliminary third spacer structure 460 on each of opposite sidewalls of the bit line structure 395 in the first direction D1 and that an upper surface of the lower contact plug 475 may not be covered to be exposed.

An ohmic contact pattern 500 may be formed on the exposed upper surface of the lower contact plug 475. In example embodiments, the ohmic contact patterns 500 may be formed by forming a first metal layer on the first and second capping patterns 385 and 387, the capping layer 380, the fence pattern 480, the eighth spacer 490, and the lower contact plug 475, thermally treating the first metal layer, and removing an unreacted portion of the first metal layer. The ohmic contact patterns 500 may include a metal silicide, e.g., cobalt silicide, nickel silicide, titanium silicide, etc.

Figure 33:
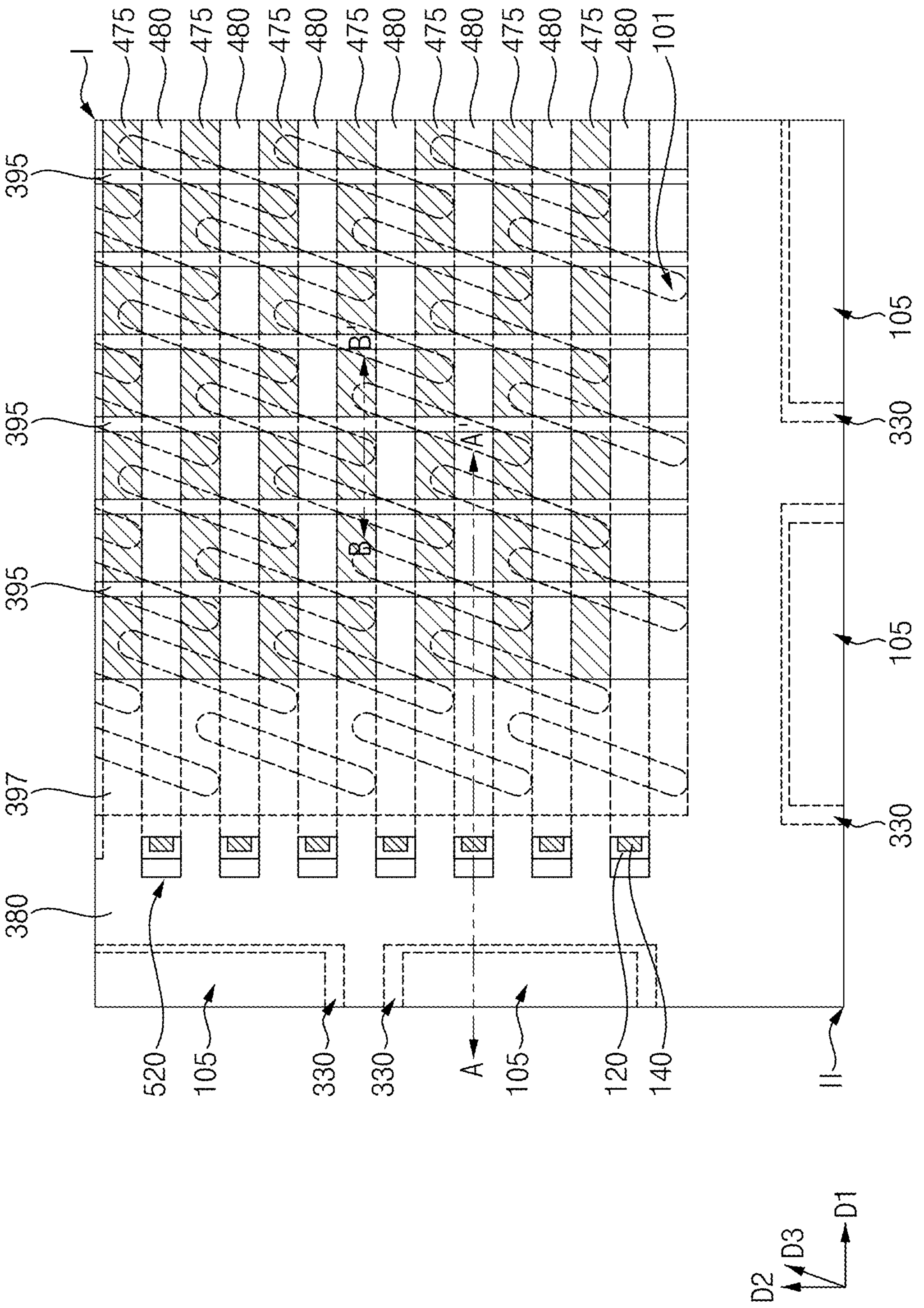
Figure 34:
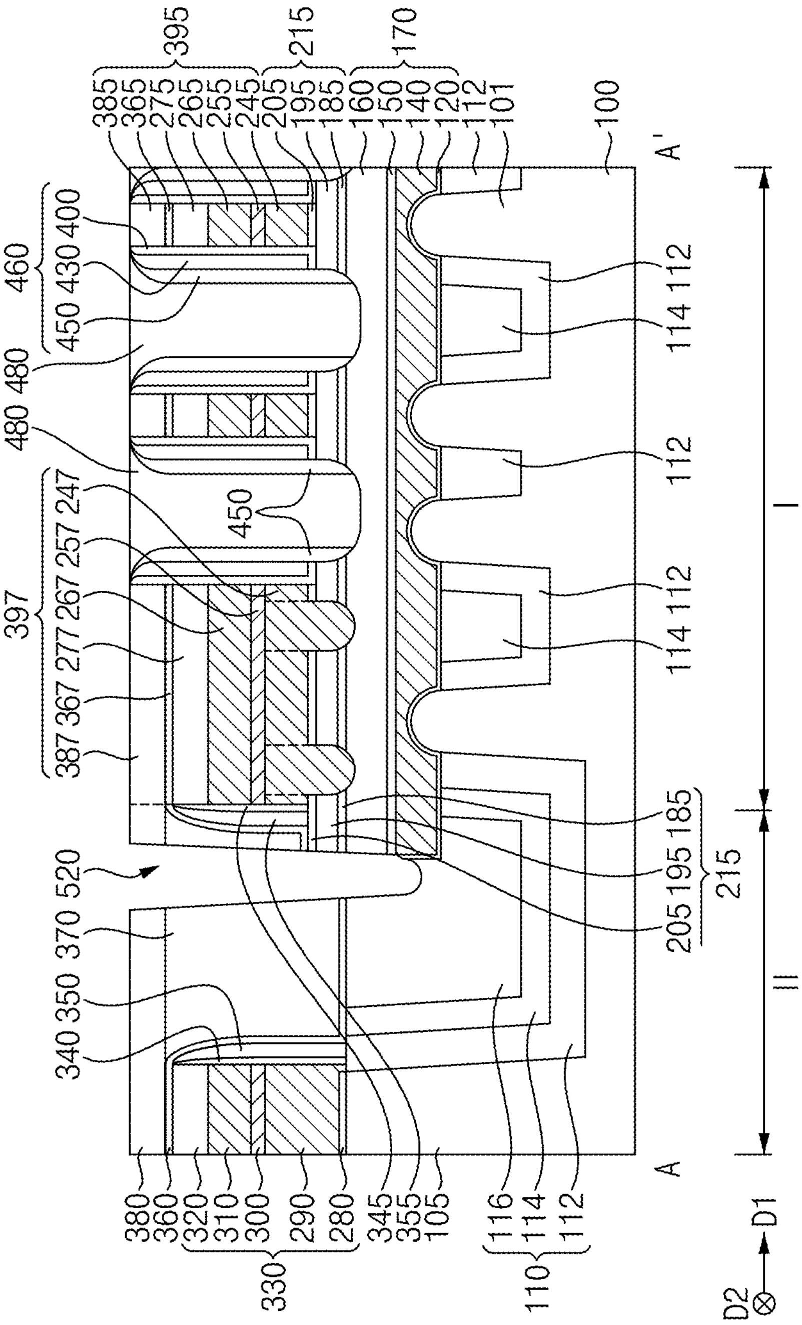

Referring to FIGS. 33 and 34, a seventh opening 520 may be formed through a portion of the capping layer 380 on the portion of the second region II of the substrate 100 adjacent to the first region I of the substrate 100, and the first insulating interlayer 370, the first etch stop layer 360, the insulation pattern structure 215, the isolation structure 110, the first gate mask 160 and the second conductive pattern 150 to expose the first conductive pattern 140, and the seventh opening 520 may also expose the first gate insulation pattern 120 on the sidewall of the first conductive pattern 140.

Figure 35:
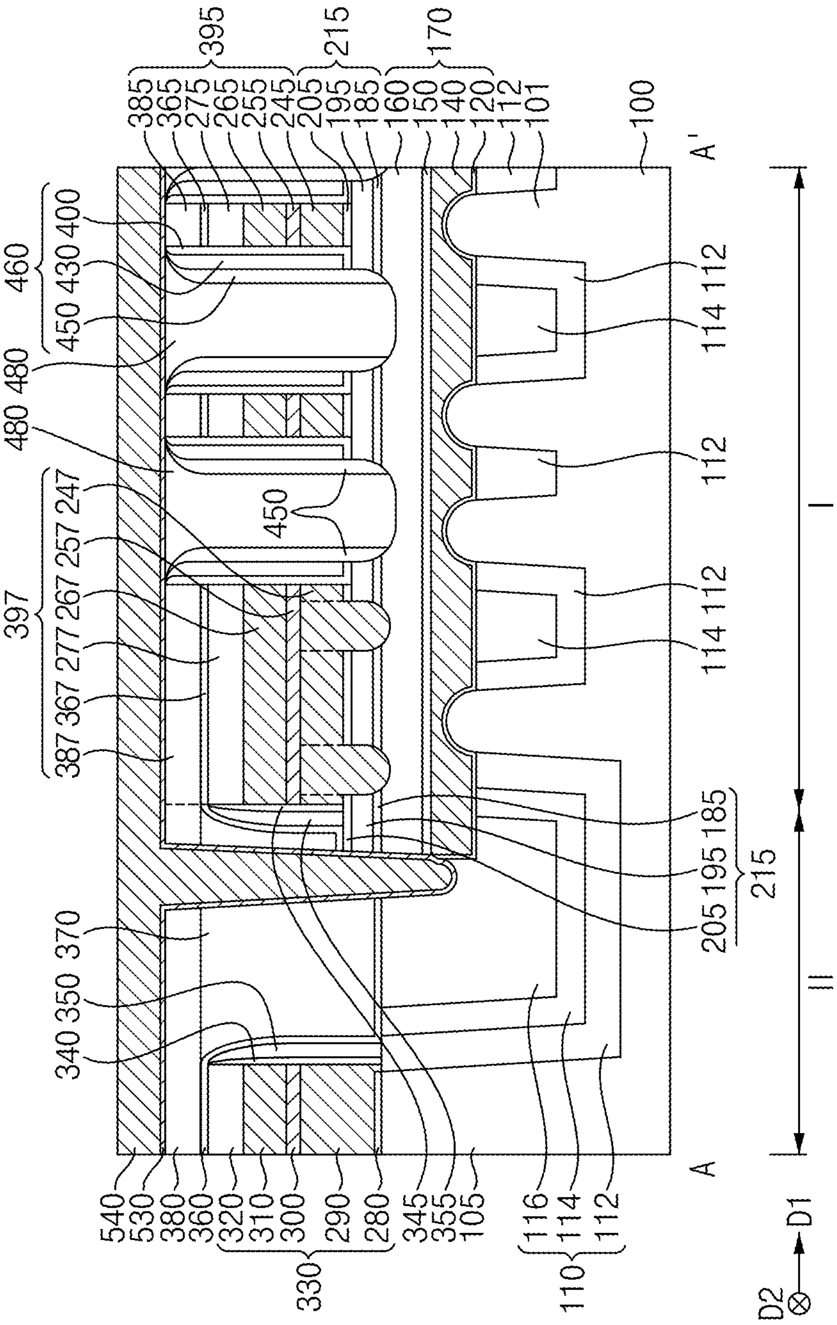
Figure 36:
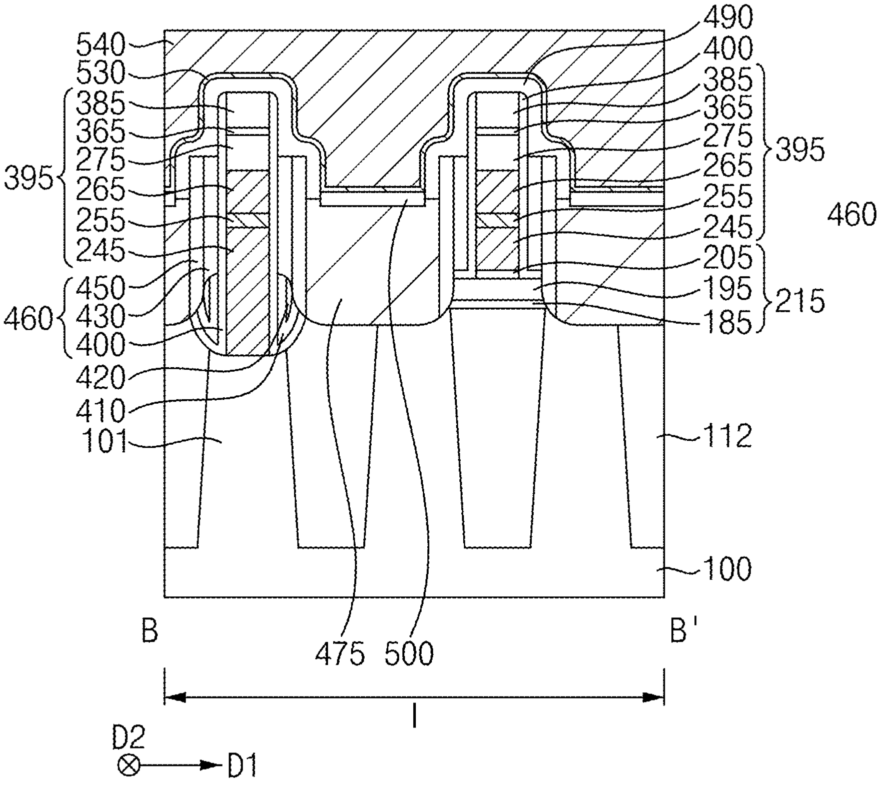

Referring to FIGS. 35 and 36, a fifth barrier layer 530 may be formed on the first and second capping patterns 385 and 387, the fence pattern 480, the eighth spacer 490, the ohmic contact pattern 500 and the lower contact plug 475 on the first region I of the substrate 100, and the capping layer 380, a sidewall of the seventh opening 520, and the first conductive pattern 140, the first gate insulation pattern 120 and the isolation structure 110 exposed by the seventh opening 520 on the second region II of the substrate 100. A second metal layer 540 may be formed on the fifth barrier layer 530 to fill a space between the bit line structures 395, between the bit line structure 395 and the dummy bit line structure 397, and the seventh opening 520.

Figure 37:
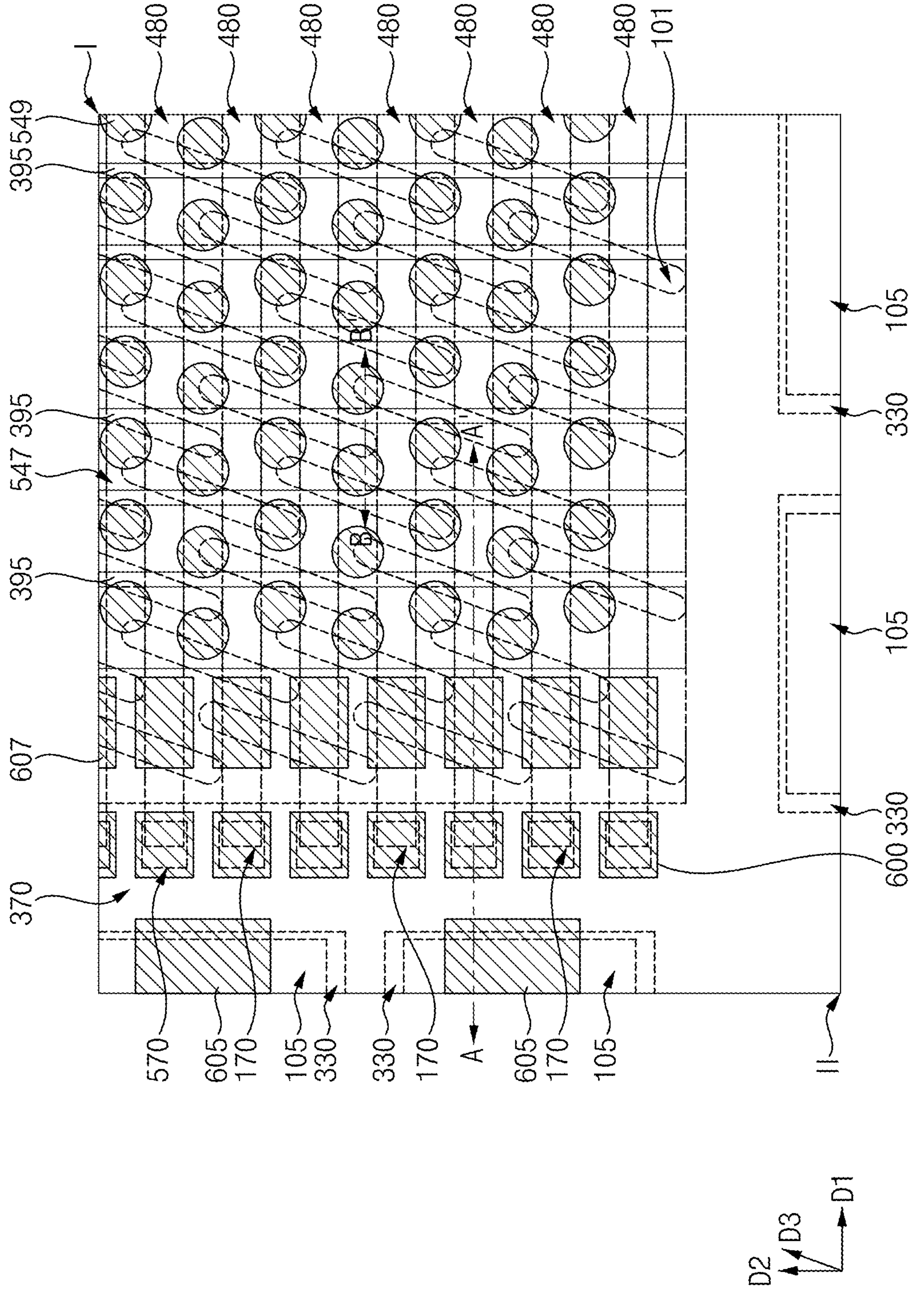
Figure 38:
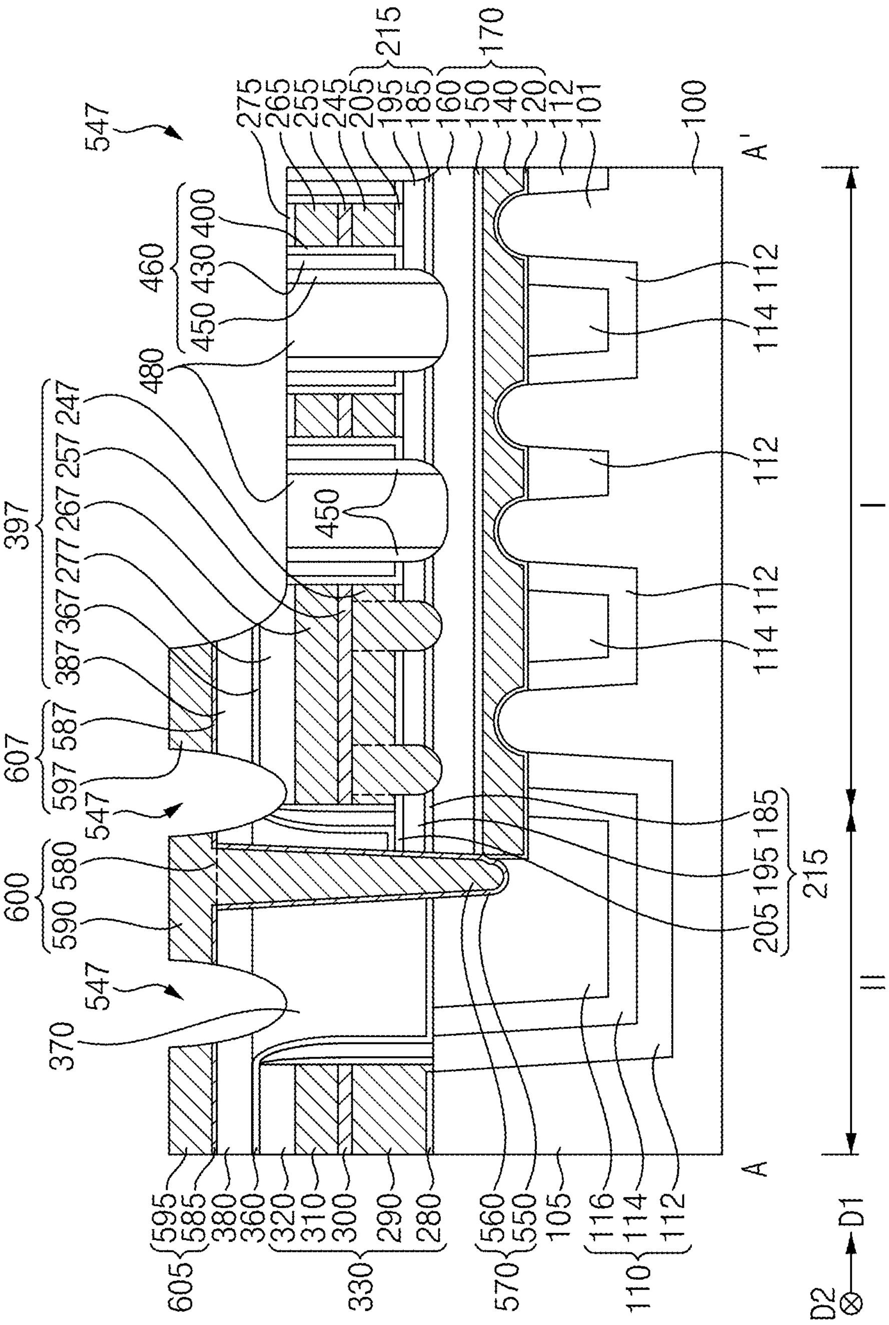
Figure 39:
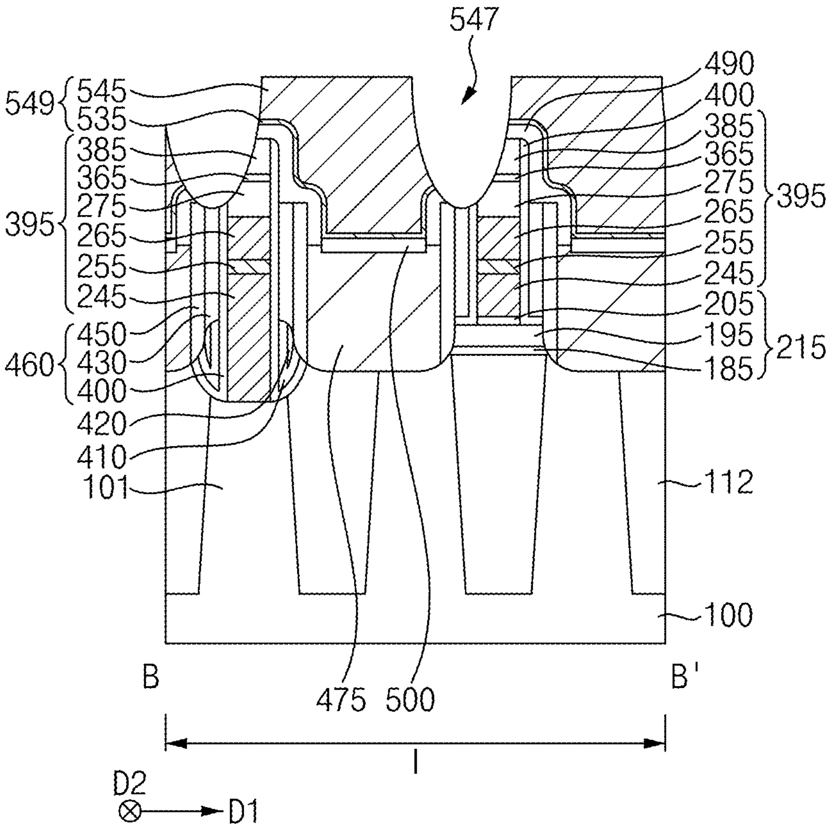
Figure 40:
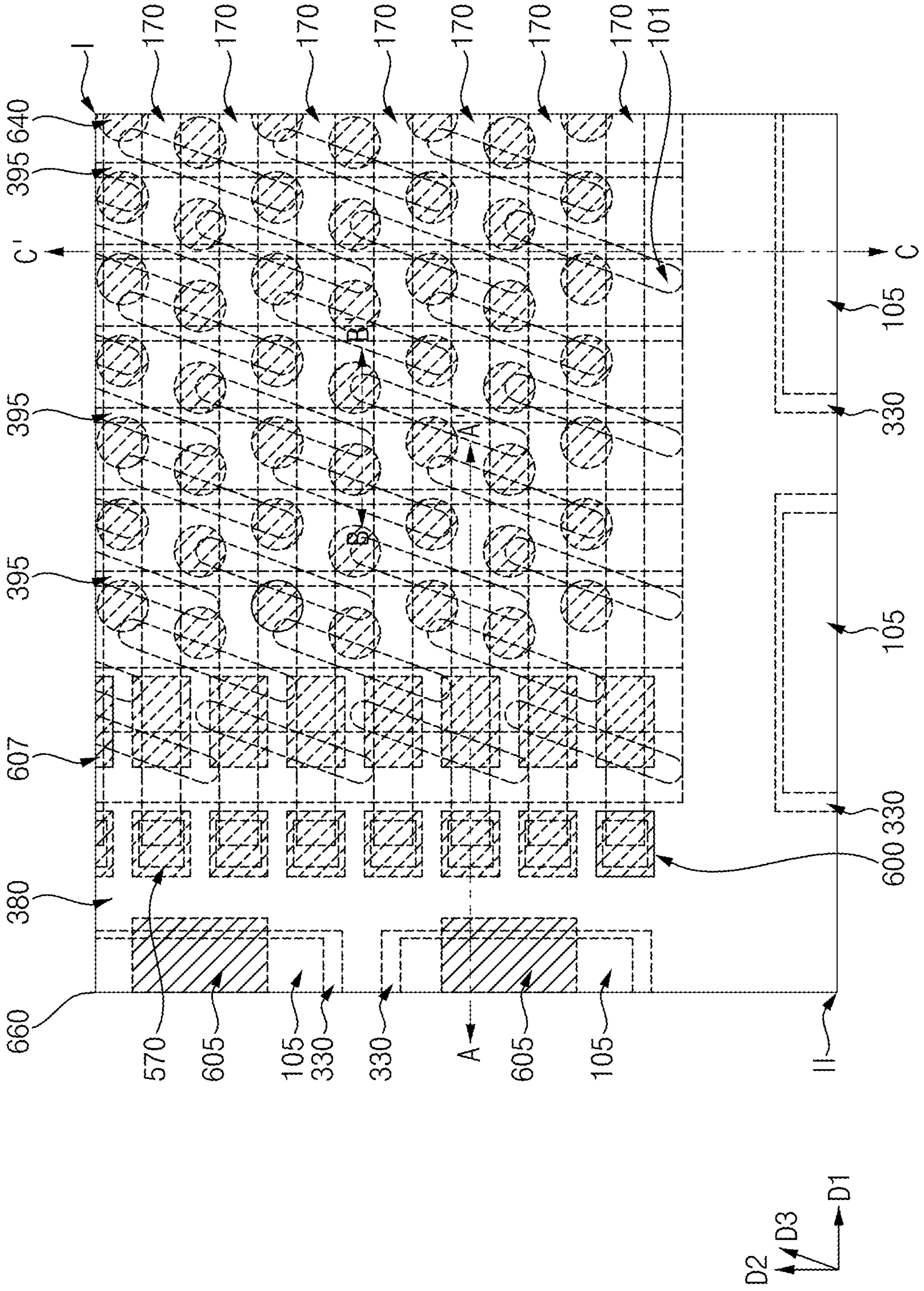
Figure 41:
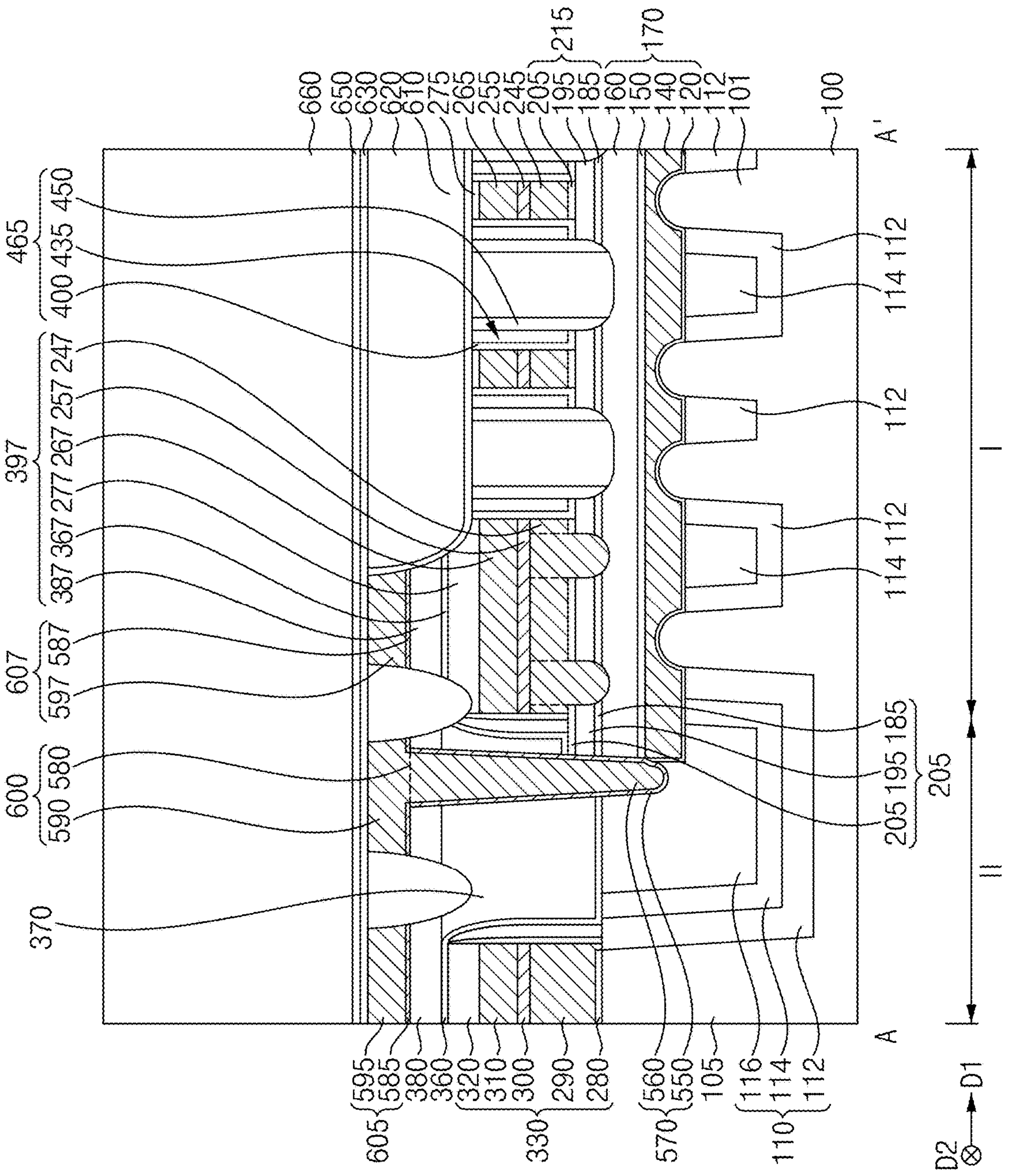
Figure 42:
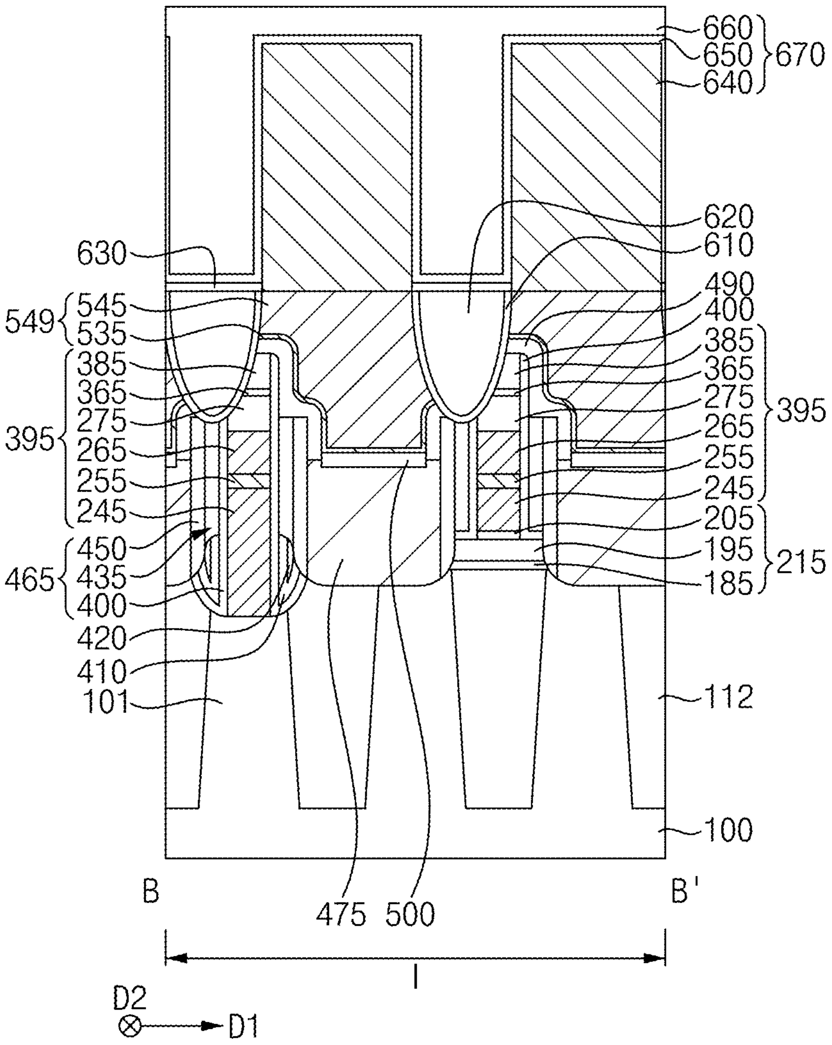
Figure 43:
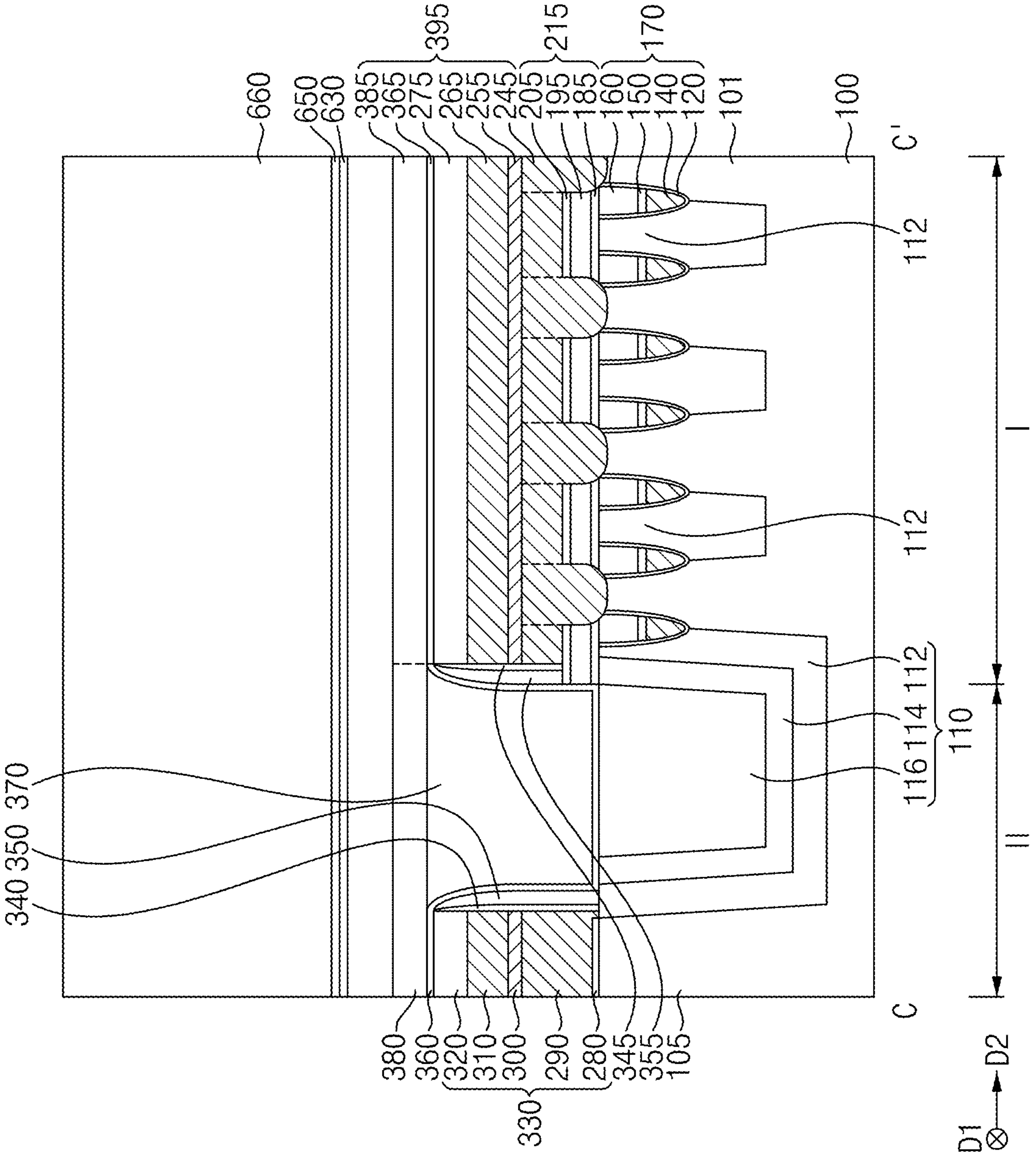

Referring to FIGS. 37 to 39, the second metal layer 540 and the fifth barrier layer 530 may be patterned.

Thus, an upper contact plug 549 may be formed on the first region I of the substrate 100, and a second wiring 605 may be formed on the second region II of the substrate 100. Additionally, a first wiring 600 may be formed on a portion of the second region II of the substrate 100 adjacent to the first region I of the substrate 100, and a third wiring 607 may be formed on a portion of the first region I of the substrate 100 adjacent to the second region II of the substrate 100. An eighth opening 547 may be formed between the upper contact plug 549 and the first to third wirings 600, 605 and 607.

The eighth opening 547 may be formed by removing not only the second metal layer 540 and the fifth barrier layer 530 but also the first and second capping patterns 385 and 387, the fence pattern 480, the capping layer 380, the preliminary third spacer structure 460, the eighth spacer 490, the first etch stop layer 360, the first etch stop pattern 365, and the second mask 275.

As the eighth opening 547 is formed, the second metal layer 540 and the fifth barrier layer 530 may be transformed into a first metal pattern 545 and a fifth barrier pattern 535, respectively, covering a lower surface of the first metal pattern 545, which may collectively form an upper contact plug 549 on the first region I of the substrate 100. In example embodiments, a plurality of upper contact plugs 549 may be formed to be spaced apart from each other in each of the first and second directions D1 and D2, and may be arranged in a honeycomb pattern or a lattice pattern in a plan view. Each of the upper contact plugs 549 may have a shape of a circle, an ellipse, or a polygon in a plan view.

The lower contact plug 475, the ohmic contact pattern 500 and the upper contact plug 549 sequentially stacked on the first region I of the substrate 100 may collectively form a first contact plug structure.

The first wiring 600 may include a third metal pattern 590 and a seventh barrier pattern 580 covering a lower surface of the third metal pattern 590, and a second contact plug 570 including a second metal pattern 560 and a sixth barrier pattern 550 may be formed in the seventh opening 520. The second wiring 605 may include a fourth metal pattern 595 and an eighth barrier pattern 585 covering a lower surface of the fourth metal pattern 595, and the third wiring 607 may include a fifth metal pattern 597 and a ninth barrier pattern 587 covering a lower surface of the fifth metal pattern 597.

In example embodiments, the first wiring 600 may overlap the seventh opening 520 in the vertical direction, and a plurality of first wirings 600 may be spaced apart from each other in the second direction D2. The first wiring 600 may be electrically connected thereto the first conductive pattern 140 through the second contact plug 570, and thus may apply electrical signal to the first gate structure 170. The second wiring 605 may overlap the second gate structure 330 in the vertical direction. The third wiring 607 may overlap the dummy bit line structure 397 in the vertical direction.

Referring to FIGS. 40 to 43, the sixth spacer 430 may be removed to form an air gap 435 connected to the eighth opening 547. The sixth spacer 430 may be removed by, e.g., a wet etching process.

In example embodiments, not only a first portion of the sixth spacer 430 on the sidewalls of the bit line structure 395 and the dummy bit line structure 397, which is directly exposed by the eighth opening 547, but also a second portion of the sixth spacer 430, which is parallel to the first portion in the horizontal direction, may be removed. That is, not only a portion of the sixth spacer 430 exposed by the eighth opening 547 not to be covered by the upper contact plug 549 but also a portion of the sixth spacer 430 covered by the upper contact plug 549 may be removed.

A second insulating interlayer may be formed to fill the eighth opening 547.

In example embodiments, the second insulating interlayer may include sixth and seventh insulation layers 610 and 620 sequentially stacked. The sixth insulation layer 610 may include a material having a poor gap filling characteristic, and thus the air gap 435 may not be filled with the sixth insulation layer 610, but may remain, which may be referred to as an air spacer 435. The fifth and seventh spacers 400 and 450 and the air spacer 435 may collectively form a third spacer structure 465. The air spacer 435 may be a spacer including an air. The seventh insulation layer 620 may include an oxide, e.g., silicon oxide or a nitride, e.g., a silicon nitride.

A capacitor 665 may be formed to contact an upper surface of the upper contact plug 549.

Particularly, a second etch stop layer 630 and a mold layer may be sequentially formed on the upper contact plug 549, the second insulating interlayer and the first to third wirings 600, 605 and 607, and may be partially etched to form a ninth opening partially exposing an upper surface of the upper contact plug 549. The second etch stop layer 630 may include a nitride, e.g., silicon nitride.

A lower electrode layer may be formed on the exposed upper surface of the upper contact plug 549 and the mold layer to fill the ninth opening, and may be planarized until an upper surface of the mold layer is exposed to form a lower electrode 640 having a pillar shape. Alternatively, the lower electrode 640 may be formed to have a cylindrical shape. The lower electrode may include, e.g., a metal, a metal nitride, a metal silicide, doped polysilicon, etc. The mold layer may be removed by, e.g., a wet etching process.

A dielectric layer 650 may be formed on a surface of the lower electrode 640 and an upper surface of the second etch stop layer 630, and an upper electrode 660 may be formed on the dielectric layer 650 to form the capacitor 670 including the lower electrode 640, the dielectric layer 650 and the upper electrode 660 on the first region I of the substrate 100.

The dielectric layer 650 may include, e.g., a metal oxide, and the upper electrode 660 may include, e.g., a metal, a metal nitride, a metal silicide, doped polysilicon, etc.

Contact plugs and upper wirings may be further formed on the substrate 100 to be electrically connected to the capacitor 670, the bit line structure 395 and the first to third wirings 600, 605 and 607, so that the fabrication of the semiconductor device may be completed.

As illustrated above, before performing the MLA process on the preliminary lower contact plug layer 470 including amorphous silicon doped with impurities and having the first thickness T1 from the upper surface of the capping layer 380 on the second region II of the substrate 100, the first and second reflective layers 700 and 710 may be formed on the preliminary lower contact plug layer 470, and the upper portion of the second reflective layer 710 on the second region II of the substrate 100 may be removed, so that the first reflective layer 700 having the second thickness T2 and the second reflective layer 710 having the third thickness T3 may be stacked on the first region I of the substrate 100 and that the first reflective layer 700 having the second thickness T2 and the second reflective layer 710 having the fourth thickness T4 may be stacked on the second region II of the substrate 100.

Figure 44:
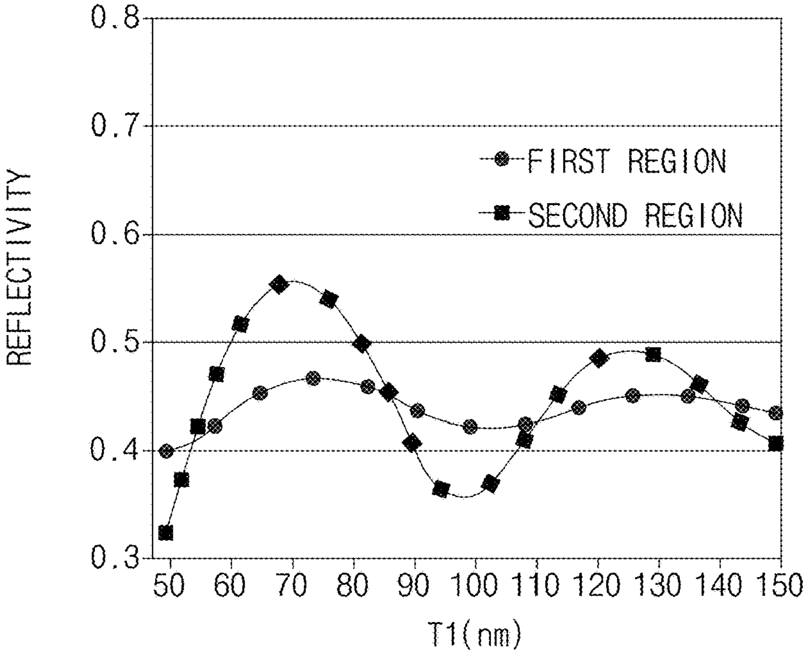
FIG. 44 is a graph showing a reflective ratio (reflectivity) of a light by simulation in which the light is incident on the first and second regions I and II of the substrate having the preliminary lower contact plug layer and the underlying structures thereon shown in FIGS. 24 and 25.

FIG. 44 is a graph showing a reflective ratio (reflectivity) of a light by simulation in which the light is incident on the first and second regions I and II of the substrate 100 having the preliminary lower contact plug layer 470 and the underlying structures thereon shown in FIGS. 24 and 25.

The light has a wavelength of about 532 nm, and is incident on the upper surface of the substrate 100 in the vertical direction.

Referring to FIG. 44, the first thickness T1 of the preliminary lower contact plug layer 470 increases from about 50 nm to about 150 nm, and the reflective ratio of the light incident on each of the first and second regions I and II of the substrate 100 periodically changes.

For example, if the first thickness T1 is about 100 nm, the reflective ratios of the lights incident on the first and second regions I and II, respectively, of the substrate 100 are about 0.42 and 0.35, respectively, and thus the reflective ratio of the second region II of the substrate 100 is less than the reflective ratio of the first region I of the substrate 100. If the first thickness T1 is about 125 nm, the reflective ratios of the lights incident on the first and second regions I and II, respectively, of the substrate 100 are about 0.44 and 0.49, respectively, and thus the reflective ratio of the second region II of the substrate 100 is greater than the reflective ratio of the first region I of the substrate 100.

That is, the first thickness T1 of the preliminary lower contact plug layer 470 may be adjusted so that the reflective ratios of the lights incident on the first and second regions I and II of the substrate 100 may be adjusted, and for example, if the first thickness T1 is about 70 nm or about 125 nm, a difference between the reflective ratio of the light incident on the second region II of the substrate 100 and the reflective ratio of the light incident on the first region I of the substrate 100 is maximized.

If, during the MLA process, the reflective ratio of the light incident on the second region II of the substrate 100 is less than the reflective ratio of the light incident on the first region I of the substrate 100, even if the same amount of energy is transferred to the first and second regions I and II of the substrate 100 by the lights, an amount of energy reaching a portion of the preliminary lower contact plug layer 470 on the second region II of the substrate 100 may be greater than an amount of energy reaching a portion of the preliminary lower contact plug layer 470 on the first region I of the substrate 100, and thus a heat transfer may occur between the portion of the preliminary lower contact plug layer 470 on the second region II of the substrate 100 to the portion of the preliminary lower contact plug layer 470 on the first region I of the substrate 100.

By the heat transfer, in the bit line structure 395 on the first region I of the substrate 100, polysilicon included in the fifth conductive pattern 245 may move to the third barrier pattern 255 including a metal silicon nitride and contacting the fifth conductive pattern 245 so that a void may be formed in the fifth conductive pattern 245, which may deteriorate the electrical characteristic of the bit line structure 395.

However, in example embodiments, the first thickness T1 of the preliminary lower contact plug layer 470 may be adjusted to satisfy Equation 1, which means the first thickness T1 may be in a range in which the difference between the reflective ratio of the light incident on the second region II of the substrate 100 and the reflective ratio of the light incident on the first region I of the substrate 100 is maximized. Thus, the generation of the void in the fifth conductive pattern 245 included in the bit line structure 395 may be prevented by adjusting the first thickness T1 of the preliminary lower contact plug layer 470, and the deterioration of the electrical characteristics of the bit line structure 395 may be prevented.

Figure 45:
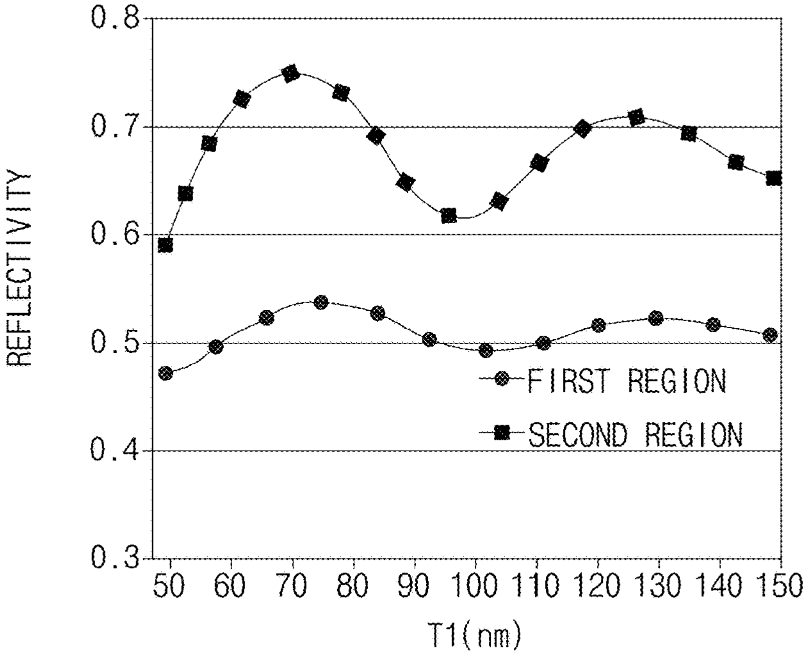
FIG. 45 is a graph showing a reflective ratio of a light by simulation in which the light is incident on the first and second regions I and II of the substrate having the preliminary lower contact plug layer, the first and second reflective layers, and the underlying structures thereon shown in FIGS. 24 and 25.

FIG. 45 is a graph showing a reflective ratio of a light by simulation in which the light is incident on the first and second regions I and II of the substrate 100 having the preliminary lower contact plug layer 470, the first and second reflective layers 700 and 710, and the underlying structures thereon shown in FIGS. 24 and 25.

The light has a wavelength of about 532 nm, and is incident on the upper surface of the substrate 100 in the vertical direction. Additionally, the second thickness T2 of the first reflective layer 700 is about 91 nm, and the third and fourth thicknesses T3 and T4 of portions of the second reflective layer 710 on the first and second regions I and II, respectively, of the substrate 100 are about 97 nm and 60 nm, respectively.

Referring to FIG. 45, like those of FIG. 44, as the first thickness T1 of the preliminary lower contact plug layer 470 increases from about 50 nm to about 150 nm, the reflective ratio of the light incident on each of the first and second regions I and II of the substrate 100 periodically changes.

However, unlike those of FIG. 44, regardless of the change of the first thickness T1 in the above range, a reflective ratio of the light incident on the second region II of the substrate 100 is greater than a reflective ratio of the light incident on the first region I of the substrate 100.

For example, if the first thickness T1 is about 100 nm, the reflective ratios of the lights incident on the first and second regions I and II, respectively, of the substrate 100 are about 0.5 and 0.62, respectively, and if the first thickness T1 is about 125 nm, the reflective ratios of the lights incident on the first and second regions I and II, respectively, of the substrate 100 are about 0.53 and 0.72, respectively. Thus, the reflective ratio of the second region II of the substrate 100 is greater than the reflective ratio of the first region I of the substrate 100.

Like those of FIG. 44, for example, if the first thickness T1 is about 70 nm or about 125 nm, a difference between the reflective ratio of the light incident on the second region II of the substrate 100 and the reflective ratio of the light incident on the first region I of the substrate 100 is maximized.

Figure 46:
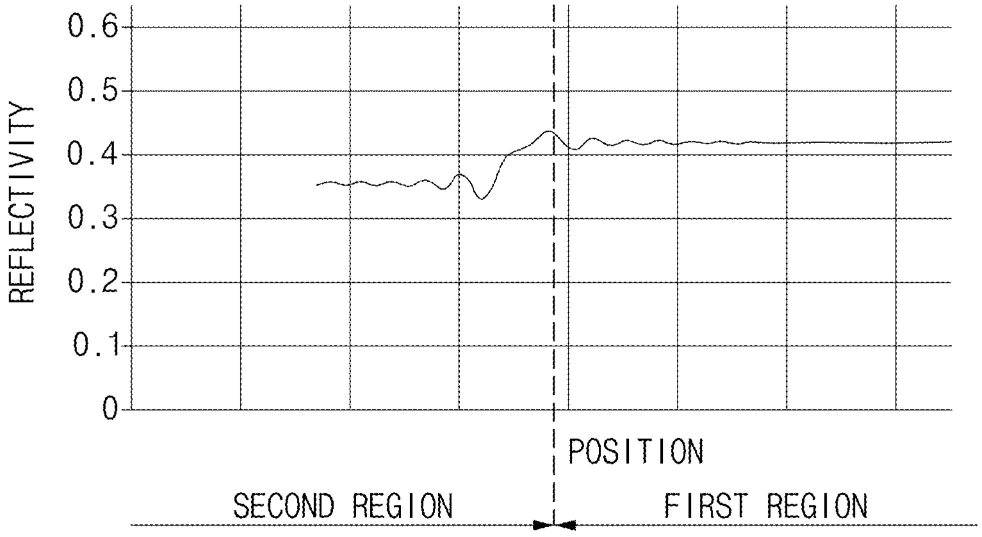
FIGS. 46 to 48 are graphs showing reflective ratios of lights by simulation in which the lights are incident on the first and second regions I and II of the substrate 100 having the preliminary lower contact plug layer 470, a reflective layer structure and the underlying structures thereon, according to Comparative Embodiment 1, Comparative Embodiment 2 and Comparative Embodiment 3.
Figure 47:
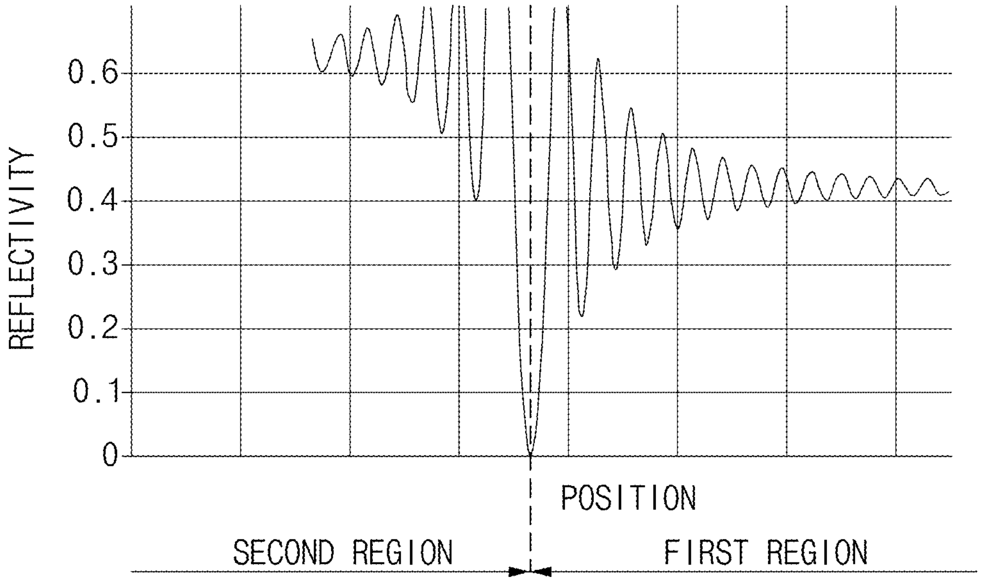
Figure 48:
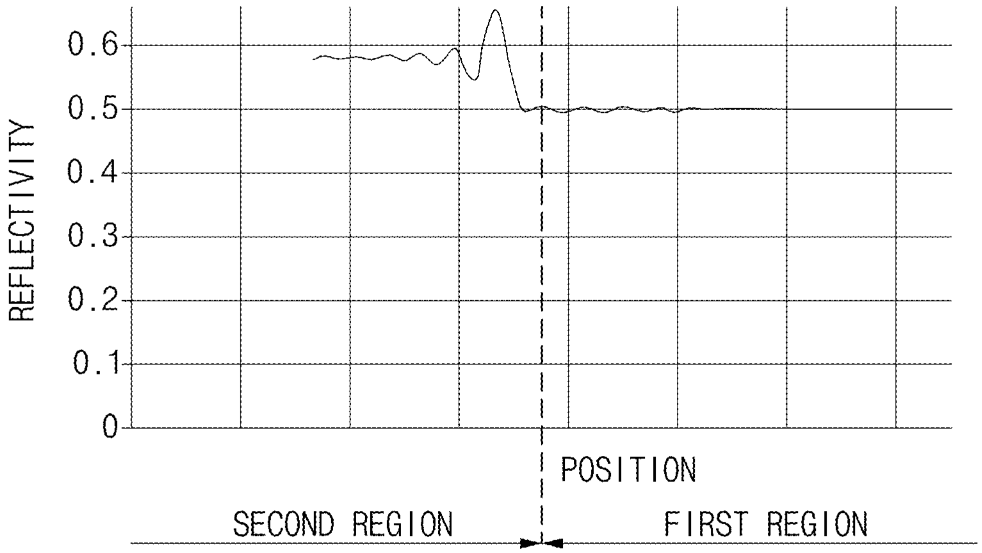

FIGS. 46 to 48 are graphs showing reflective ratios of lights by simulation in which the lights are incident on the first and second regions I and II of the substrate 100 having the preliminary lower contact plug layer 470, a reflective layer structure and the underlying structures thereon, according to Comparative Embodiment 1, Comparative Embodiment 2 and Comparative Embodiment 3.

No reflective layer structure is formed on the preliminary contact plug layer 470 in Comparative Embodiment 1, the reflective layer structure is formed only on the portion of the preliminary lower contact plug layer 470 on the second region II of the substrate 100 in Comparative Embodiment 2, and the reflective layer structure is formed on both the portions of the preliminary lower contact plug layer 470 on the first and second regions I and II of the substrate 100 in Comparative Embodiment 3.

The first thickness T1 of the preliminary lower contact plug layer 470 is about 100 nm, the second thickness T2 of the first reflective layer 700 included in the reflective layer structure is about 91 nm, the third thickness T3 of the portion of the second reflective layer 710 included in the reflective layer structure on the first region I of the substrate 100 is about 97 nm, and the fourth thickness T4 of the portion of the second reflective layer 710 included in the reflective layer structure on the second region II of the substrate 100 is about 60 nm.

Referring to FIGS. 46 to 48, reflective ratios of lights incident on the first and second regions I and II, respectively, of the substrate 100 are about 0.42 and 0.35, respectively, in Comparative Embodiment 1, reflective ratios of lights incident on the first and second regions I and II, respectively, of the substrate 100 are about 0.42 and 0.62, respectively, in Comparative Embodiment 2, and reflective ratios of lights incident on the first and second regions I and II, respectively, of the substrate 100 are about 0.49 and 0.58, respectively, in Comparative Embodiment 3.

That is, in Comparative Embodiment 1, the reflective ratio of the second region II of the substrate 100 is less than the reflective ratio of the first region I of the substrate 100, while in Comparative Embodiment 2 and Comparative Embodiment 3, the reflective ratio of the second region II of the substrate 100 is greater than the reflective ratio of the first region I of the substrate 100. A difference between a maximum value and a minimum value of the reflective ratio of the first region I of the substrate 100, that is, an amplitude is about 2.0% in Comparative Embodiment 2, while an amplitude of the reflective ratio of the first region I of the substrate 100 is about 0.04% in Comparative Embodiment 3. That is, the reflective ratio of the second region II of the substrate 100 is greater than the reflective ratio of the first region I of the substrate 100 in both Comparative Embodiment 2 and Comparative Embodiment 3, while a distribution of the reflective ratio in Comparative Embodiment 3 is less than a distribution of the reflective ratio in Comparative Embodiment 2.

Table 1 shows reflective ratios of lights, incident energies and transition energies by simulation in which lights are incident on the first and second regions I and II of the substrate 100 having the preliminary lower contact plug layer 470, the reflective layer structure and the underlying structures thereon, according to Comparative Embodiment 4, Comparative Embodiment 5 and Example embodiment.

The first thickness T1 of the preliminary lower contact plug layer 470 on the upper surface of the capping layer 380 on the second region II of the substrate 100 is about 100 nm in Comparative Embodiment 4 and Comparative Embodiment 5, and is about 125 nm in Example embodiment. A thickness from a lower surface of the preliminary lower contact plug layer 470 on the first region I of the substrate 100 is about 243 nm in Comparative Embodiment 4 and Comparative Embodiment 5, and is about 268 nm in Example embodiment.

The reflective layer structure including the first and second reflective layers 700 and 710 is formed only on the second region II of the substrate 100 in Comparative Embodiment 4, and the reflective layer structure including the first and second reflective layers 700 and 710 is formed both on the first and second regions I and II of the substrate 100 in Comparative Embodiment 5 and Example embodiment.

The first reflective layer 700 having the second thickness T2 of about 91 nm and the second reflective layer 710 having the fourth thickness T4 of about 60 nm are stacked on the upper surface of the portion of the preliminary lower contact plug layer 470 on the second region II of the substrate 100 in Comparative Embodiment 4. The first reflective layer 700 having the second thickness T2 of about 91 nm is formed on the upper surface of the preliminary lower contact plug layer 470 on the first and second regions I and II of the substrate 100, and the second reflective layer 710 having the third thickness T3 of about 97 nm on the first region I of the substrate 100 and having the fourth thickness T4 of about 60 nm on the second region II of the substrate 100 is formed in Comparative Embodiment 5 and Example embodiment.

TABLE 1

| | T1 (nm) | first region reflective ratio | second region reflective ratio | incident energy (mJ) range | incident energy (mJ) margin | transition energy (mJ) |
|---|---|---|---|---|---|---|
| Comparative Embodiment 4 | 100 | 0.42 | 0.62 | 551-611 | 60 | 320-354 |
| Comparative Embodiment 5 | 100 | 0.53 | 0.62 | 680-754 | 74 | 320-354 |
| Example embodiment | 125 | 0.53 | 0.72 | 750-831 | 81 | 352-391 |

Referring to Table 1, in Comparative Embodiment 4, a transition energy that is required for the preliminary lower contact plug layer 470 to be recrystallized after being melted by an MLA process on the first region I of the substrate 100 is in a range of about 320 mJ to about 354 mJ. If the transition energy is less than about 320 mJ, the preliminary lower contact plug layer 470 cannot be sufficiently melted not to be recrystallized, and if the transition energy is more than about 354 mJ, a void may be generated in the fifth conductive pattern 245 due to excessive heat. The reflective ratio of the first region I of the substrate 100 is about 0.42, and thus a transition ratio is about 0.58. Accordingly, an incident energy required to be incident on the first region I of the substrate 100 is in a range of about 551 mJ to about 611 mJ, and thus there is an energy margin of about 60 mJ.

In Comparative Embodiment 5, the reflective ratio of the first region I of the substrate 100 is about 0.53, and thus a transition ratio is about 0.47. Accordingly, in consideration that the transition energy is in a range of about 320 mJ to about 354 mJ, an incident energy required to be incident on the first region I of the substrate 100 is in a range of about 680 mJ to about 754 mJ, and thus there is an energy margin of about 74 mJ.

In Example Embodiment, the thickness of the preliminary lower contact plug layer 470 on the first region I of the substrate 100 is about 268 nm, which is about 1.1 times of the thickness of the preliminary lower contact plug layer 470 on the first region I of the substrate 100 of Comparative Embodiment 5, that is, about 243 nm. Accordingly, the transition energy is in a range of about 352 mJ to about 391 mJ, and an incident energy required to be incident on the first region I of the substrate 100 is in a range of about 750 mJ to about 831 mJ. Thus, there is an energy margin of about 81 mJ.

As a result, the energy margin for performing the MLA process of the Example Embodiment is greater than the energy margins for performing the MLA processes of the Comparative Embodiment 4 and Comparative Embodiment 5. Particularly, the energy margin of the Example Embodiment is greater than the energy margin of the Comparative Embodiment 4 by about 21 mJ.

Table 2 shows distributions of a reflective ratio of a light incident on a portion of the first region I of the substrate 100 adjacent to the second region II of the substrate 100 according to variations of the second distance S2 from the end portion in the second direction D2 of the portion of the second reflective layer 710 having the third thickness T3 to the boundary of the first region I of the substrate 100 in the second direction D2, when the light is incident on the substrate 100 having the reflective layer structure of the Example Embodiment.

TABLE 2

| S2(nm) | reflective ratio distribution |
|---|---|
| −200 | 0.056 |
| −100 | 0.0537 |
| 0 | 0.0327 |
| 100 | 0.0166 |
| 200 | 0.025 |
| 300 | 0.019 |
| 400 | 0.017 |
| 500 | 0.0239 |

Referring to Table 2, when the end portion in the second direction D2 of the portion of the second reflective layer 710 having the third thickness T3 is spaced apart from the boundary of the first region I of the substrate 100 in the second direction D2 by about 500 nm, the reflective ratio distribution is equal to or less than about 5.6%.

Particularly, when the end portion in the second direction D2 of the portion of the second reflective layer 710 having the third thickness T3 is spaced apart from the boundary of the first region I of the substrate 100 in the second direction D2 by about 400 nm, the reflective ratio distribution is equal to or less than about 2%.

Thus, in example embodiments, the second distance S2 is equal to or less than about 500 nm, preferably, in a range of about 300 nm to about 400 nm. As the reflective ratio distribution of the light of the portion of the first region I of the substrate 100 adjacent to the second region II of the substrate 100 is so low that the MLA process may be stably performed.

In the method of manufacturing the semiconductor device in accordance with example embodiments, after forming the reflective layer structure on the preliminary lower contact plug layer 470, the MLA process may be performed so that the preliminary lower contact plug layer 470 including amorphous silicon may be converted into the lower contact plug 472 including polysilicon.

The reflective ratio of the portion of the reflective layer structure on the second region II of the substrate 100 may not be greater than the reflective ratio of the portion of the reflective layer structure on the first region I of the substrate 100, and thus a void may not be generated through the phenomenon in which silicon included in the fifth conductive pattern 245 of the bit line structure 395 on the first region I of the substrate 100 moves into the third barrier pattern 255 by heat transfer from the second region II of the substrate 100 to the first region I of the substrate 100.

The preliminary lower contact plug layer 470 under the reflective layer structure may have the first thickness T1 satisfying Equation 1 and the first and second reflective layers 700 and 710 included in the reflective layer structure may have the second to fourth thicknesses T2, T3 and T4 satisfying Equations 2 to 4 such that the reflective layer structure may have a desired reflective ratio.

Further, as the preliminary lower contact plug layer 470 and the first and second reflective layers 700 and 710 have the proper thicknesses, an incident energy that may be incident on the preliminary lower contact plug layer 470 through which the preliminary lower contact plug layer 470 including amorphous silicon may be melted into the lower contact plug layer 472 including polysilicon may have increased margin. As the incident energy margin decreases according to the high integration of the semiconductor device, the MLA process may not be easily performed. However, in example embodiments, the MLA process may have increased process margin by forming the reflective layer structure, and thus may be easily performed.

Figure 49:
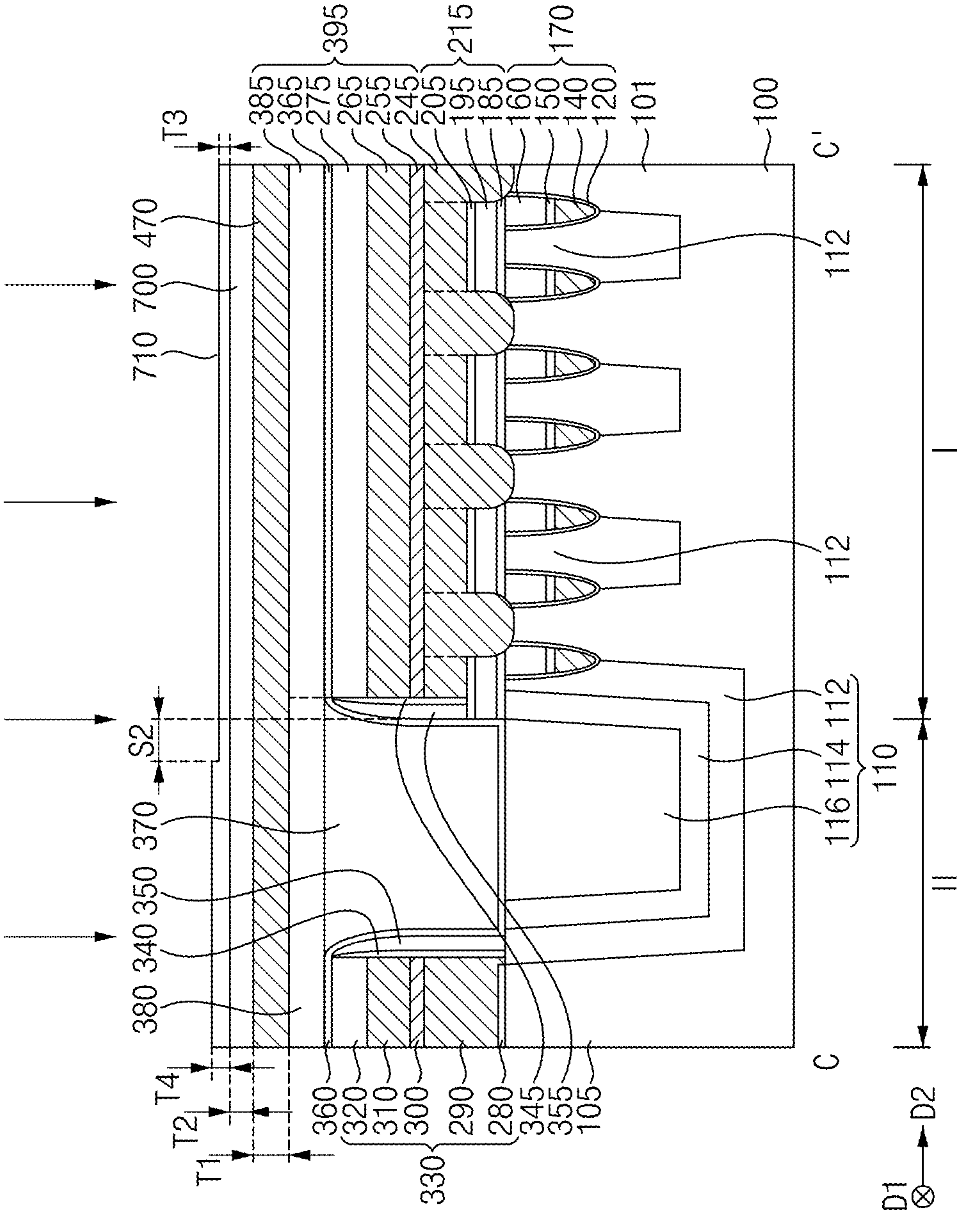
FIGS. 49 and 50 are cross-sectional views illustrating a method of manufacturing a semiconductor device in accordance with example embodiments, which correspond to FIGS. 26 and 27, respectively.
Figure 50:
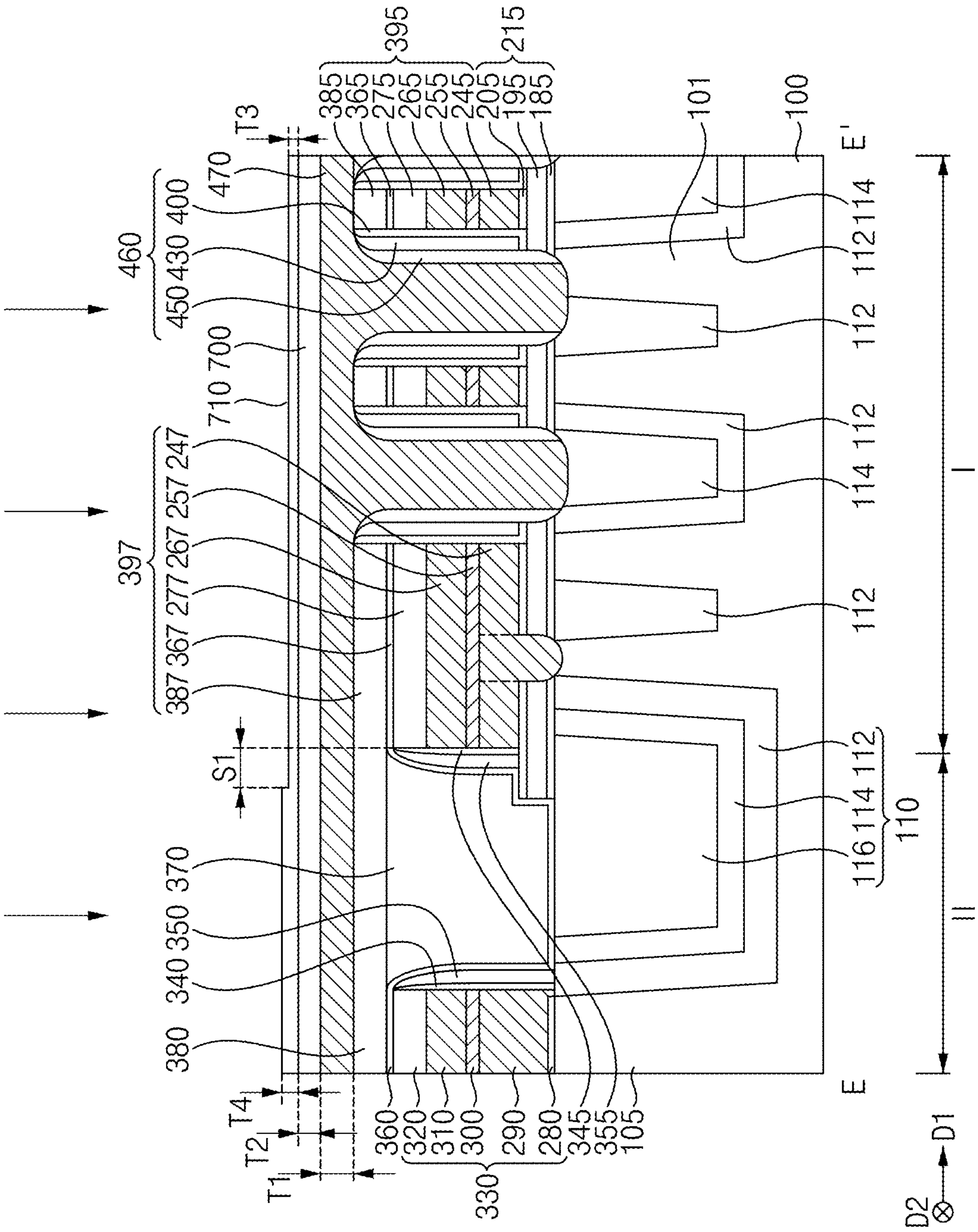

FIGS. 49 and 50 are cross-sectional views illustrating a method of manufacturing a semiconductor device in accordance with example embodiments, which correspond to FIGS. 26 and 27, respectively.

This method may include processes substantially the same as or similar to those illustrated with respect to FIGS. 1 to 43, and thus repeated explanations thereof are omitted herein.

Referring to FIGS. 49 and 50, processes substantially the same as or similar to those illustrated with respect to FIGS. 24 and 25 may be performed to form the preliminary lower contact plug layer 470 and the first and second reflective layers 700 and 710.

The first and second reflective layers 700 and 710 may have the second and fourth thicknesses T2 and T4. An upper portion of the portion of the second reflective layer 710 on the first region I of the substrate 100 may be removed by an etching process, and thus the third thickness T3 of the portion of the second reflective layer 710 on the first region I of the substrate 100 may be less than the fourth thickness T4.

Processes substantially the same as or similar to those illustrated with respect to FIGS. 26 and 27 may be performed so that the preliminary lower contact plug layer 470 may be converted into the lower contact plug layer 472 by an MLA process, and processes substantially the same as or similar to those illustrated with respect to FIGS. 28 to 43 may be performed to complete the fabrication of the semiconductor device.

As illustrated above, if only the third thickness T3 of the portion of the second reflective layer 710 on the first region I of the substrate 100 satisfies Equation 3 or Equation 4, the third thickness T3 may not be greater than the fourth thickness T4, and may be less than the fourth thickness T4. In this case, after forming the first and second reflective layers 700 and 710, instead of removing the upper portion of the portion of the second reflective layer 710 on the second region II of the substrate 100, a portion of the second reflective layer 710 on the first region I of the substrate 100 may be removed to form the reflective layer structure.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While inventive concepts have been shown and described with reference to example embodiments thereof, it will be understood by those of ordinary skill in the art that various changes in form and details may be made thereto without departing from the spirit and scope of inventive concepts as set forth by the following claims.

What is claimed is:

1. A method of manufacturing a semiconductor device, the method comprising:

forming a first gate structure on a first region of a substrate, the substrate including the first region and a second region;

forming a bit line structure on the first gate structure;

forming a preliminary contact plug layer including amorphous silicon on the substrate;

forming a reflective layer structure on the preliminary contact plug layer, the reflective layer structure including a first reflective layer having a first refractive index and a second reflective layer having a second refractive index, the second refractive index being greater than the first refractive index, and a thickness of a portion of the second reflective layer on the first region of the substrate being different than a thickness of a portion of the second reflective layer on the second region of the substrate;

forming a contact plug layer from the preliminary contact plug layer, the forming the contact plug layer including performing a melting laser annealing (MLA) process of irradiating a laser on the reflective layer structure so that the amorphous silicon of the preliminary contact plug layer is converted into polysilicon; and forming a capacitor on the contact plug layer.

2. The method according to claim 1, wherein the thickness of the portion of the second reflective layer on the first region of the substrate is greater than the thickness of the portion of the second reflective layer on the second region of the substrate.

3. The method according to claim 1, wherein a thickness of a part of the second reflective layer on the second region of the substrate adjacent to the first region of the substrate is equal to the thickness of the portion of the second reflective layer on the first region of the substrate, and an end portion of the part of the second reflective layer is over a part of the substrate and the part of the substrate is spaced apart from a boundary between the first region of the substrate and the second region of the substrate by a distance equal to or less than 500 nm.

4. The method according to claim 3, wherein the part of the substrate is spaced apart from the boundary between the first region of the substrate and the second region of the substrate by a distance in a range of 300 nm to 400 nm.

5. The method according to claim 1, wherein the thickness of the portion of the second reflective layer on the first region of the substrate is less than the thickness of the portion of the second reflective layer on the second region of the substrate.

6. The method according to claim 1, wherein the first reflective layer has a first thickness represented by T1, the thickness of the portion of the second reflective layer on the first region of the substrate is a second thickness represented by T2, the thickness of the portion of the second reflective layer on the first region of the substrate is a third thickness represented by T3, the first thickness, the second thickness, and the third thickness respectively satisfy Equations 1, 2 and 3, as follows, $$T1 = (1/4 + \Delta_1)\lambda/n_1 \quad \text{(Equation 1)}$$

$$T2 = (1/4 + \Delta_2)\lambda/n_2 \quad \text{(Equation 2)}$$

$$T3 = (1/4 + \Delta_3)\lambda/n_2 \quad \text{(Equation 3)}$$

wherein, in Equations 1-3, $\Delta_1$, $\Delta_2$, $\Delta_3$ respective are a first optical path correction factor, a second optical path correction factors, and a third optical path correction factor, $\lambda$ is a wavelength of the laser, $n_1$ is the first refractive index of the first reflective layer, $n_2$ is the second refractive index of the second reflective layer, $-1/8 \le \Delta_1 \le 1/8$, $-1/4 \le \Delta_2 \le 1/4$, and $-1/8 \le \Delta_3 \le 1/8$.

7. The method according to claim 6, wherein the first thickness, the second thickness, and the third thickness have values of about 91 nm, about 97 nm and about 60 nm, respectively.

8. The method according to claim 6, wherein the second thickness has a value in a range of 24 nm to 218 nm.

9. The method according to claim 8, wherein the second thickness has a value in a range of 87 nm to 107 nm.

10. The method according to claim 1, further comprising:

a second gate structure on the second region of the substrate; and a capping layer on the second gate structure, the capping layer including silicon nitride, wherein the preliminary contact plug layer has a first thickness represented by T1 from an upper surface of the capping layer, and the first thickness (T1) satisfies Equation 1, as follows, $$(N/2+1/8+\Delta)\lambda/n_1+\delta_1 \le T1 \le (N/2+3/8+\Delta)\lambda/n_1+\delta_2 \quad \text{(Equation 1)}$$

wherein, in Equation 1,

N is 1, 2 or 3,

Δ is an optical path correction factor,

λ is a wavelength of the laser, n is a refractive index of the preliminary contact plug layer, $-8\ \text{nm} \le \delta_1 \le 8\ \text{nm}$, $-8\ \text{nm} \le \delta_2 \le 8\ \text{nm}$, and $-1/4 \le \Delta \le 1/4$.

11. The method according to claim 10, wherein the first thickness is in a range of 89 m to 133 nm.

12. A method of manufacturing a semiconductor device, the method comprising:

forming a first gate structure on a cell region of a substrate, the substrate including the cell region and a peripheral circuit region;

forming a bit line structure on the first gate structure;

forming a preliminary contact plug layer including amorphous silicon on the substrate;

forming a reflective layer structure on the preliminary contact plug layer, the reflective layer structure including a first reflective layer having a first refractive index and a second reflective layer having a second refractive index, the second refractive index being greater than the first refractive index;

forming a contact plug layer from the preliminary contact plug layer, the forming the contact plug layer including performing a melting laser annealing (MLA) process of irradiating a laser on the reflective layer structure so the amorphous silicon of the preliminary contact plug layer is converted into polysilicon; and forming a capacitor on the contact plug layer, wherein a reflective ratio of light on the peripheral circuit region of the substrate is greater than a reflective ratio of the light on the cell region of the substrate.

13. The method according to claim 12, wherein a thickness of a portion of the second reflective layer on the cell region of the substrate is different from a thickness of a portion of the second reflective layer on the peripheral circuit region of the substrate.

14. The method according to claim 12, wherein a thickness of a part of the second reflective layer on the peripheral circuit region of the substrate adjacent to the cell region of the substrate is equal to a thickness of a portion of the second reflective layer on the cell region of the substrate, and an end portion of the part of the second reflective layer is over a part of the substrate and the part of the substrate is spaced apart from a boundary between the cell region and the peripheral circuit region of the substrate by a distance equal to or less than 500 nm.

15. The method according to claim 12, further comprising:

a second gate structure on the peripheral circuit region of the substrate; and a capping layer on the second gate structure, the capping layer including silicon nitride, wherein the preliminary contact plug layer has a first thickness represented by T1 from an upper surface of the capping layer, and the first thickness (T1) satisfies Equation 1, as follows, $$(N/2+1/8+\Delta)\lambda/n_1+\delta_1 \le T1 \le (N/2+3/8+\Delta)\lambda/n_1+\delta_2 \quad \text{(Equation 1)}$$

wherein, in Equation 1,

Δ is an optical path correction factor,

λ is a wavelength of the laser, n is a refractive index of the preliminary contact plug layer, $-8\ \text{nm} \le \delta_1 \le 8\ \text{nm}$, $-8\ \text{nm} \le \delta_2 \le 8\ \text{nm}$, and $1/4 \le \Delta \le 1/4$.

16. The method according to claim 15, wherein the first reflective layer has a second thickness represented by T2, a portion of the second reflective layer on the cell region of the substrate has a third thickness represented by T3, a portion of the second reflective layer on the peripheral circuit region has a fourth thickness represented by T4, and the second to fourth thicknesses satisfy Equations 2, 3 and 4, as follows, $$T2 = (1/4+\Delta_2)\lambda/n_2 \quad \text{(Equation 2)}$$

$$T3 = (1/4+\Delta_3)\lambda/n_3 \quad \text{(Equation 3)}$$

$$T4 = (1/4+\Delta_4)\lambda/n_3 \quad \text{(Equation 4)}$$

wherein, in Equations 2 to 4,

λ is a wavelength of the laser, $n_2$ is the refractive index of the first reflective layer, $n_3$ is the refractive index of the second reflective layer, $-1/8 \le \Delta_2 \le 1/8$, $-1/4 \le \Delta_3 \le 1/4$, and $-1/8 \le \Delta_4 \le 1/8$.

17. A method of manufacturing a semiconductor device, the method comprising:

forming a first gate structure on a cell region of a substrate, the substrate including the cell region and a peripheral circuit region;

forming a bit line structure and a second gate structure on the cell region and the peripheral circuit region, respectively, of the substrate;

forming a preliminary contact plug layer including amorphous silicon on the substrate to cover the bit line structure and the second gate structure;

forming a reflective layer structure on the preliminary contact plug layer, the reflective layer structure including a first reflective layer having a first refractive index and a second reflective layer having a second refractive index, the second refractive index being greater than the first refractive index, and a thickness of a portion of the second reflective layer on the cell region of the substrate being different than a thickness of a portion of the second reflective layer on the peripheral circuit region of the substrate;

performing a melting laser annealing (MLA) process that includes irradiating a laser on the reflective layer structure so that the preliminary contact plug layer is converted into a lower contact plug layer including polysilicon;

planarizing the lower contact plug layer to form a lower contact plug;

forming an upper contact plug on the lower contact plug; and forming a capacitor on the upper contact plug.

18. The method according to claim 17, further comprising:

removing an upper portion of the substrate to form an active pattern, wherein the first gate structure extends through an upper portion of the active pattern, the bit line structure is on a central portion of the active pattern, and the lower contact plug is on an end portion of the active pattern.

19. The method according to claim 17, wherein a thickness of the portion of the second reflective layer on the cell region of the substrate is greater than a thickness of the portion of the second reflective layer on the peripheral circuit region of the substrate.

20. The method according to claim 17, wherein the first gate structure extends in a first direction, the bit line structure extends in a second direction, the first direction and the second direction are parallel to an upper surface of the substrate, the second direction is perpendicular to the first direction, a thickness of a part of the second reflective layer on the peripheral circuit region of the substrate adjacent to the cell region of the substrate in the second direction is equal to the thickness of the portion of the second reflective layer on the cell region of the substrate, and an end portion of the part of the second reflective layer is over a part of the substrate and part of the substrate is spaced apart from a boundary between the cell region of the substrate and the peripheral circuit region of the substrate by a distance equal to or less 500 nm.

* * * * *